(12) United States Patent
Bosdriesz

(10) Patent No.: US 10,769,864 B2
(45) Date of Patent: Sep. 8, 2020

(54) METHOD AND SYSTEM FOR MODELLING A BUILDING STRUCTURE

(71) Applicant: AUTO-MEASURE PTY LIMITED, Sydney NSW (AU)

(72) Inventor: James Bosdriesz, Springwood (AU)

(73) Assignee: Auto-Measure Pty Limited, Sydney NSW (AU)

( * ) Notice: Subject to any disclaimer, the term of this patent is extended or adjusted under 35 U.S.C. 154(b) by 0 days.

(21) Appl. No.: 16/164,654

(22) Filed: Oct. 18, 2018

(65) Prior Publication Data

US 2020/0126312 A1 Apr. 23, 2020

Related U.S. Application Data

(63) Continuation of application No. 14/418,419, filed as application No. PCT/AU2013/000864 on Aug. 7, 2013, now abandoned.

(30) Foreign Application Priority Data

Aug. 13, 2012 (AU) ................................ 2012903470
Apr. 10, 2013 (AU) ................................ 2013203521

(51) Int. Cl.
*G06T 19/20* (2011.01)
*G06F 30/00* (2020.01)

(52) U.S. Cl.
CPC .............. *G06T 19/20* (2013.01); *G06F 30/00* (2020.01)

(58) Field of Classification Search
CPC ...................................................... G06F 17/50
See application file for complete search history.

(56) References Cited

U.S. PATENT DOCUMENTS 6,446,030 B1 * 9/2002 Hoffman ............... G01C 15/002
702/159
7,127,378 B2 10/2006 Hoffman et al.
(Continued)

OTHER PUBLICATIONS

Adan, et al. "Automatic Creation of Semantically Rich 3D Building Models from Laser Scanner Data," Proceedings of the International Symposium on Automation and Robotics in Construction (ISARC), Jun. 2011.

(Continued)

*Primary Examiner* — Phi Hoang
(74) *Attorney, Agent, or Firm* — Knobbe Martens Olson & Bear, LLP

(57) ABSTRACT

The present invention relates to a system and method for modelling the physical characteristics of a building. Models of buildings, such as floor plans, are often produced when renovation work or other work is planned. Manual measurements maybe taken (e.g. using a tape measure or an optical distance meter), and these measurements are subsequently used by a draftsman to construct a model of the measured space. This is time consuming. The present invention provides a system and method which includes a measurement and modelling process which assigns a unique identifier to openings that are shared by adjoining rooms when plotting measurements. These room associations are then used to determine the layout of the rooms within a building model. There is significantly less time and cost involved in generating a computer model of the measured space, using the present system and method.

17 Claims, 19 Drawing Sheets

(56) References Cited

U.S. PATENT DOCUMENTS

| | | | | |
|---|---|---|---|---|
| 7,302,359 | B2* | 11/2007 | McKitterick | G01C 7/06 |
| | | | | 340/990 |
| 8,260,581 | B2* | 9/2012 | Hoguet | G06F 30/398 |
| | | | | 703/1 |
| 9,679,362 | B2 | 6/2017 | Chmielewski et al. | |
| 2004/0109012 | A1* | 6/2004 | Kraus | G01C 15/00 |
| | | | | 715/700 |
| 2005/0177350 | A1 | 8/2005 | Kishikawa | |
| 2006/0190312 | A1 | 8/2006 | Onuma et al. | |
| 2008/0266295 | A1 | 10/2008 | Temesvari et al. | |
| 2008/0310733 | A1 | 12/2008 | Adabala | |
| 2010/0104141 | A1 | 4/2010 | Kmiecik et al. | |
| 2011/0153279 | A1 | 6/2011 | Zhang et al. | |
| 2012/0095945 | A1 | 4/2012 | Jones et al. | |
| 2013/0011069 | A1 | 1/2013 | Quan et al. | |
| 2014/0028678 | A1 | 1/2014 | Chmielewski et al. | |
| 2015/0242542 | A1* | 8/2015 | Bosdriesz | G01B 11/14 |
| | | | | 703/1 |
| 2019/0020817 | A1* | 1/2019 | Shan | H04N 5/23293 |

OTHER PUBLICATIONS

Extended European Search Report dated Jun. 15, 2016 for European Patent Application No. 13829448.3 which corresponds in priority to above-identified subject U.S. application.

International Search Report dated Oct. 22, 2013 for International Application No. PCT/AU2013/000864 filed Aug. 7, 2013.

* cited by examiner

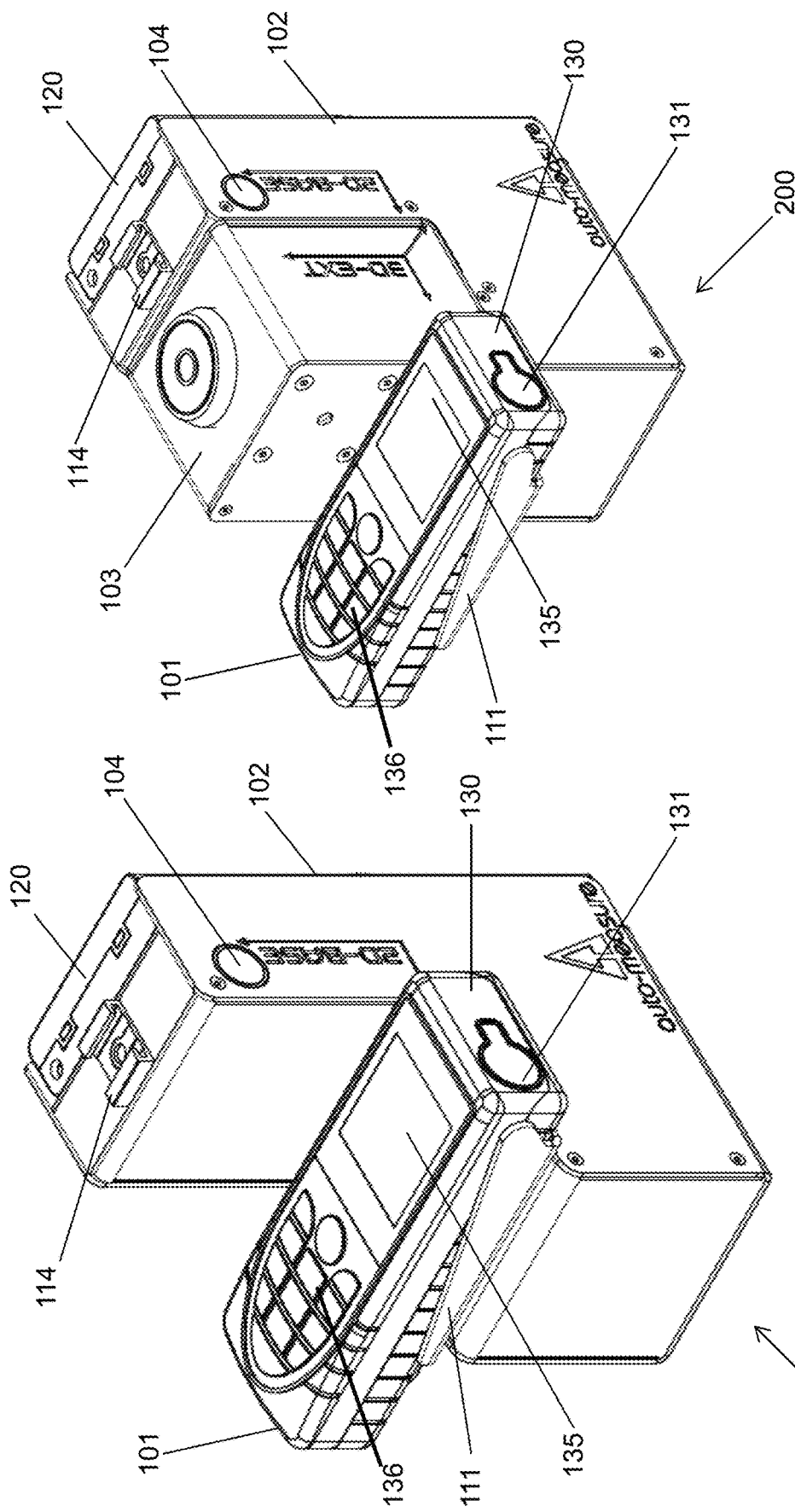

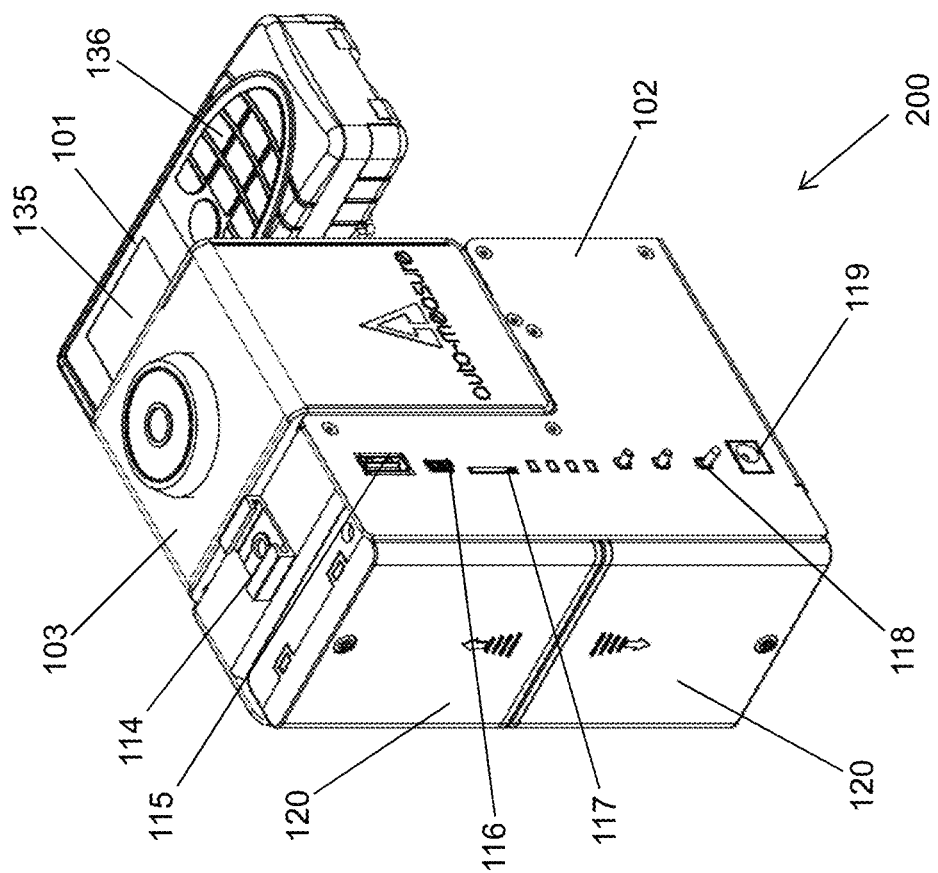
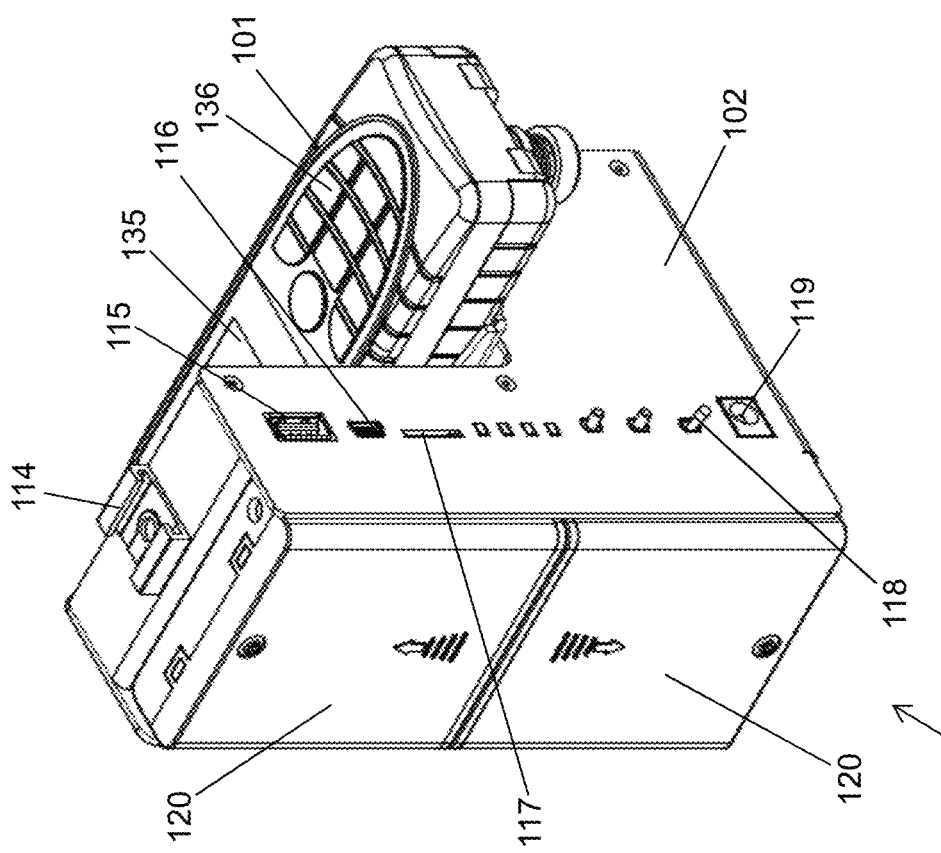

1. Equi-rectangular wire-frame of Lounge

2. Equi-rectangular Wire-frame of Kitchen

3. Equi-rectangular wire-frame of Hallway capture point 1

4. Equi-rectangular wire-frame of Hallway capture point 2

*1. Identify Openings in Lounge*

*2. Identify Openings in Kitchen*

*3. Identify Openings in Hallway Scan 1*

1. Identified Openings in Lounge reflected upon wire-frame

2. Identified Openings in Kitchen reflected upon wire-frame

3. Identified Openings in Hallway Scan 1 reflected upon wire-frame

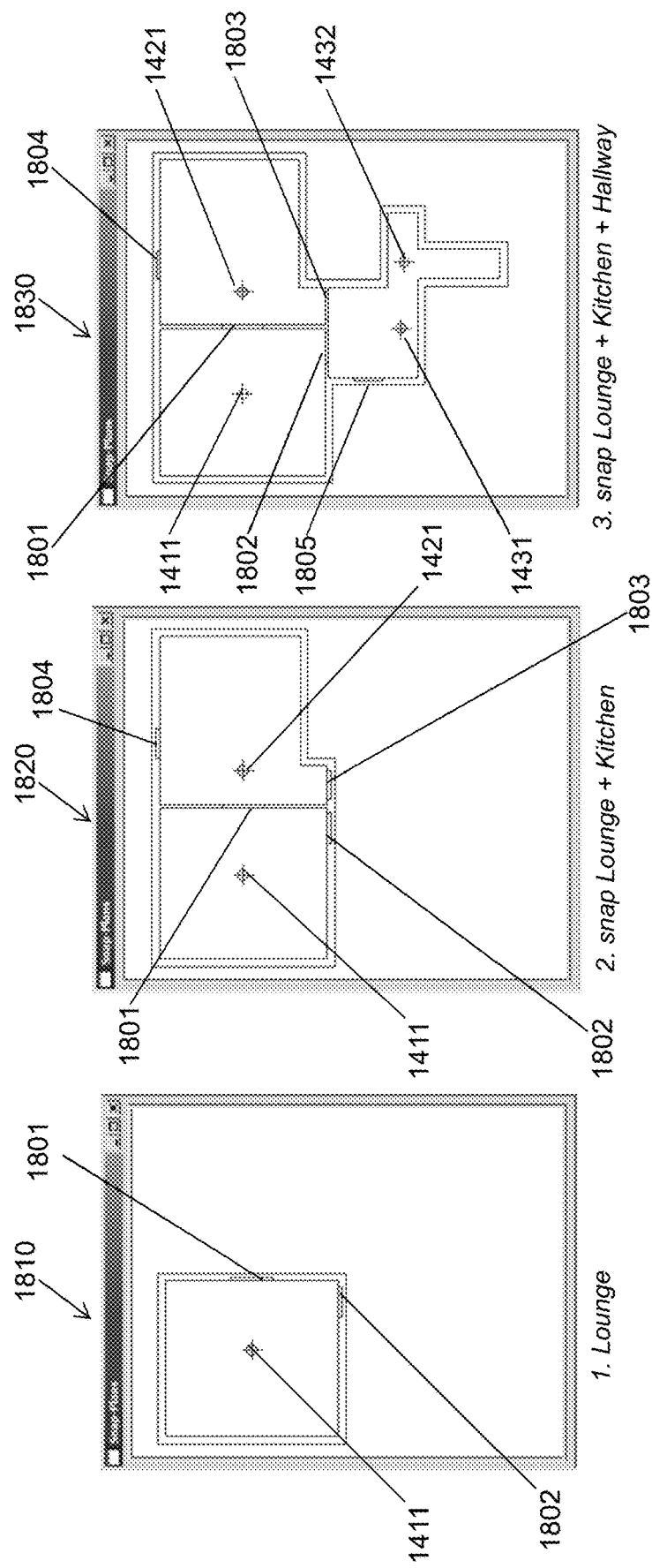

Figure 19A

PLACE — FLOOR 1
OWNER: John Citizen
ADDRESS: 8 Main St, New City
LOCATION: GPS: 1234567890
DESCRIPTION: Brick Veneer 2 Storey Dwelling
STOREY: New
SPACE
SCAN 1. Fill out Place details

Figure 19B

PLACE — FLOOR 1
SPACE — ROOM 3
● Inside  ○ Outside
NAME: ROOM 3
STOREY: FLOOR 1
MEDIA: New
NAME:
Type: Still
SCAN 2. Fill out Space details

Figure 19C

PLACE — FLOOR 1
SPACE — ROOM 3
SCAN — 4
● Horz  ● Vert
● CW    ○ ACW
Speed: Fast — Slow
Time: 1min — 5min
Accuracy: 1cm — 1mm
Pano Photos: 8
Photo Count: 3
☐ Enable Flash
Mode 3. Fill out Scan details and press Go

METHOD AND SYSTEM FOR MODELLING A BUILDING STRUCTURE

FIELD OF THE INVENTION

The present invention relates to a system and method for modelling buildings.

BACKGROUND OF THE INVENTION

Spatial building models typically reproduce the physical characteristics of a building (such as the internal layout of rooms) in a scaled form. Most contemporary graphic building models are produced using computer modelling software.

Models of existing buildings are often produced when renovation work is planned (such as an interior remodelling). The models may be produced in two dimensions (such as a floor plan) or three dimensions depending on the type of work that is scheduled and modelling capabilities available.

Measurements for a graphic building model are commonly captured by a tradesmen or an estimator in advance of planned renovations. A tape measure or an optical distance meter may be used to obtain individual measurements of a room. These measurements are then typically recorded in a scrap book or digital file.

The measurements captured for a building are subsequently used by a draftsman to construct a computer model of the measured space. The draftsman creates the building model from the captured measurements and any notes taken by the surveyor.

The overall modelling process can be time consuming. Both the measurement and modelling aspects are typically performed by skilled workers with some previous experience. The tools used to capture the building measurements and the attentiveness of the individuals involved in both measuring and modelling the building can influence the accuracy of the final building model.

SUMMARY OF INVENTION

In accordance with a first aspect, the invention provides a building modelling system comprising:

a measurement tool configured to survey a building an interior space having a plurality of rooms, the measurement tool having a spatial sensor that maps room boundaries, and a modelling tool that generates a computer model of the building from measurements of individual rooms generated by the measurement tool, the modelling tool assigning a unique identifier to openings that are shared by adjoining rooms, the unique identifiers defining room associations within the building, the modelling tool using the room associations to determine the layout of rooms within a building model.

In accordance with a second aspect, the invention provides a computer implemented modelling tool comprising:

a modelling module that generates room models from room measurements, the modelling module assigning a unique identifier to openings that are shared by adjoining rooms, and a layout module that arranges the individual room models in a building model, the layout module using the unique identifiers assigned to each shared opening to determine the layout of rooms within the building model.

In accordance with a third aspect, the invention provides a building modelling method comprising:

storing a plurality of room measurements that define the boundaries of corresponding rooms within a building in computer memory, identifying common openings shared by adjoining rooms within the building and assigning each shared opening a unique identifier that is linked to the stored room measurements, and generating a building model from the individual room measurements using the unique identifiers assigned to each shared opening to determine the layout of rooms within the building model.

In accordance with a third aspect, the invention provides a measurement tool comprising:

a spatial sensor that maps room boundaries, a base module that supports the spatial sensor, the base module having a drive that rotates the spatial sensor with respect to the room boundaries, and an orientation sensor that determines an absolute orientation of the spatial sensor.

An advantage of at least one embodiment of the disclosed modelling tool is that the modelling software can automatically generate individual room models from measurements it has received. The room models can then be used to automatically construct a model of the structure once openings shared by adjacent rooms have been identified. This significantly reduces the overhead needed to create a structure model (such as a building floor plan).

The foregoing summary is illustrative only and is not intended to be in any way limiting. In addition to the illustrative aspects, embodiments, and features described in the summary, further aspects, embodiments and features will become apparent by reference to the drawings and the following detailed description.

BRIEF DESCRIPTION OF THE FIGURES

FIG. 1a is a front perspective view of a measurement tool with a single degree of freedom. The tool comprises a motorised base coupled to an electronic distance meter.

FIG. 1b is a front perspective view of a measurement tool with two degrees of freedom. The tool comprises the motorised base and distance meter shown in FIG. 1a with a motorised extension module disposed between them.

FIG. 2a is a rear perspective view of the measurement tool shown in FIG. 1a.

FIG. 2b is a rear perspective view of the measurement tool shown in FIG. 1b.

FIG. 3a is a front elevation of the measurement tool shown in FIG. 1a.

FIG. 4a is a top view of the measurement tool shown in FIG. 1a.

FIG. 4b is a top view of the measurement tool shown in FIG. 1b.

FIG. 5a is a left side elevation of the measurement tool shown in FIG. 1a.

FIG. 6a is a right side elevation of the measurement tool shown in FIG. 1a.

FIG. 7a is a lower elevation of the measurement tool shown in FIG. 1a.

FIG. 8a is a rear elevation of the measurement tool shown in FIG. 1a.

FIG. 16a is a composite room model that depicts a portion of the lounge illustrated in FIG. 14a.

FIG. 18a is a reproduction of the room model depicted in FIG. 14a with the room openings identified.

FIG. 18b is a reproduction of the room models illustrated in FIGS. 14a and 14b arranged in a partial building model with the respective room openings identified.

FIG. 18c is a reproduction of the room models depicted in FIGS. 14a to 14c arranged in a partial building model with the respective openings identified.

FIG. 19a is a schematic representation of a user interface for a measurement system that enables a user to define mapping attributes for a room and/or building. A 'PLACE' tab of the interface is depicted.

FIG. 19b is a schematic representation of the user interface illustrated in 19a depicting the 'SPACE' tab.

FIG. 19c is a schematic representation of the user interface illustrated in FIG. 19a depicting the 'SCAN' tab.

DETAILED DESCRIPTION OF EMBODIMENTS OF THE INVENTION

Figure 3B:
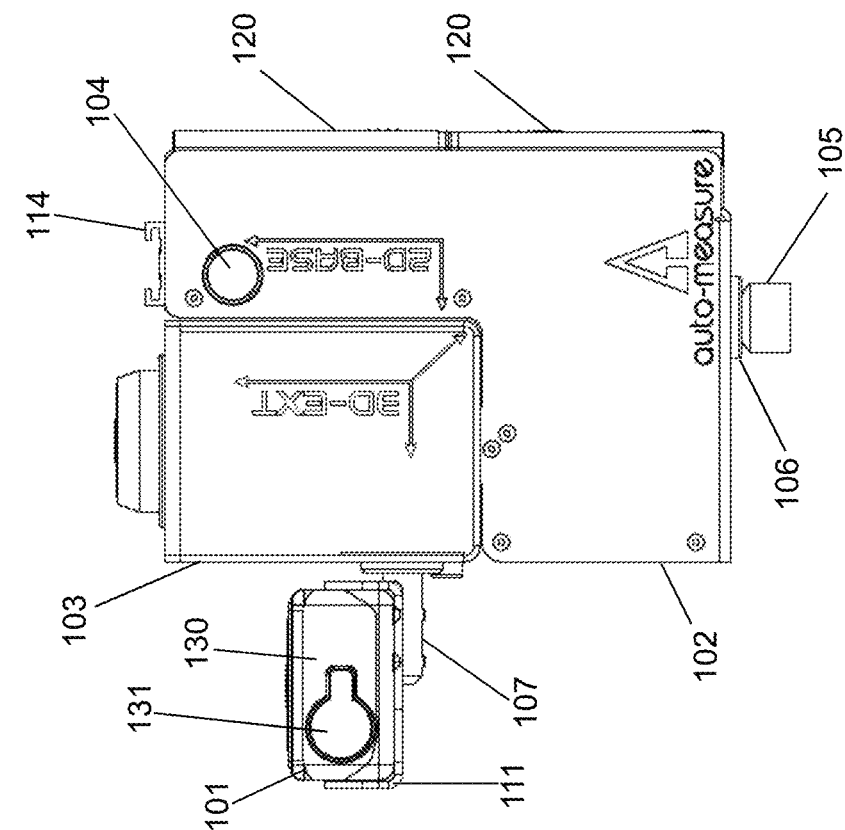
FIG. 3b is a front elevation of the measurement tool shown in FIG. 1b.
Figure 3A:
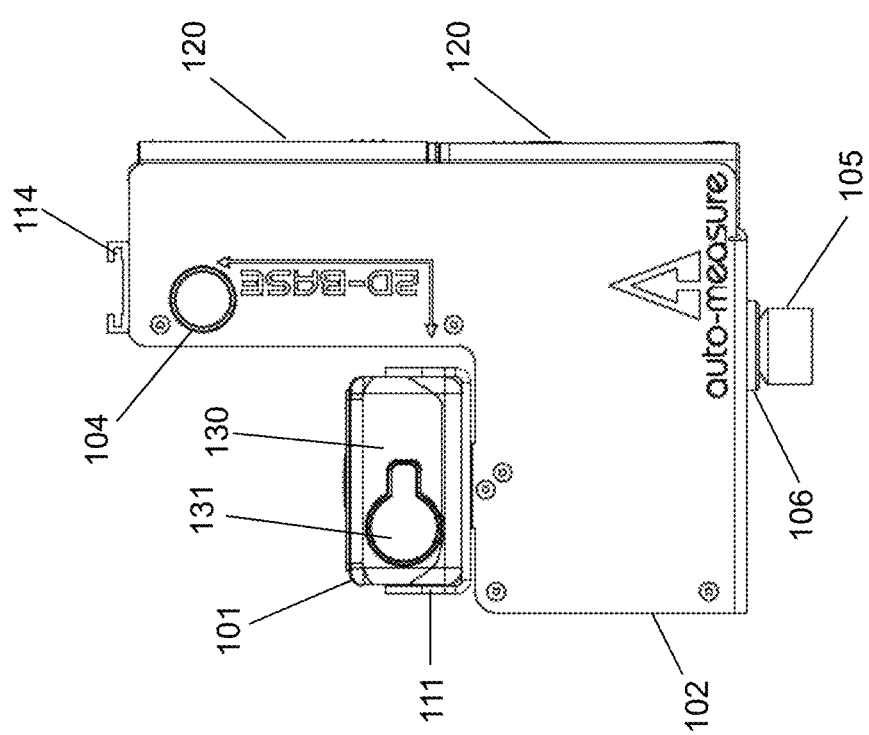
Figures 4A, 4B:
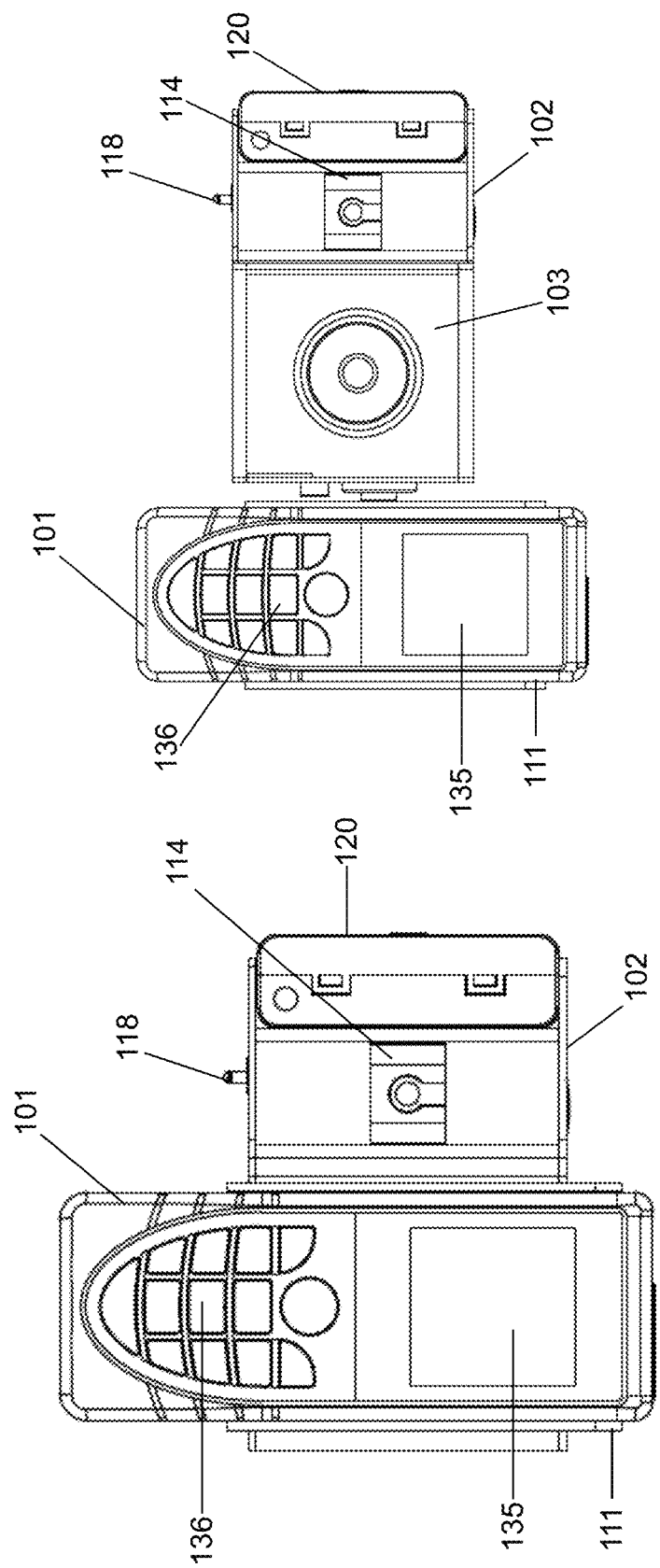
Figure 5B:
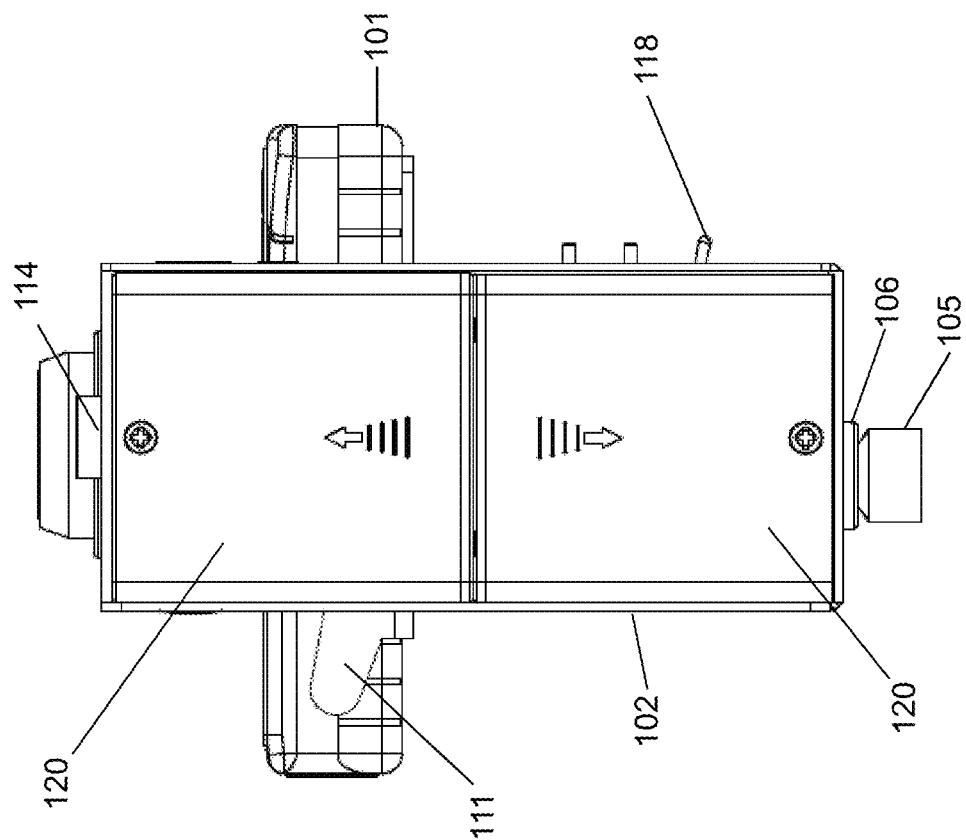
FIG. 5b is a left side elevation of the measurement tool shown in FIG. 1b.
Figure 5A:
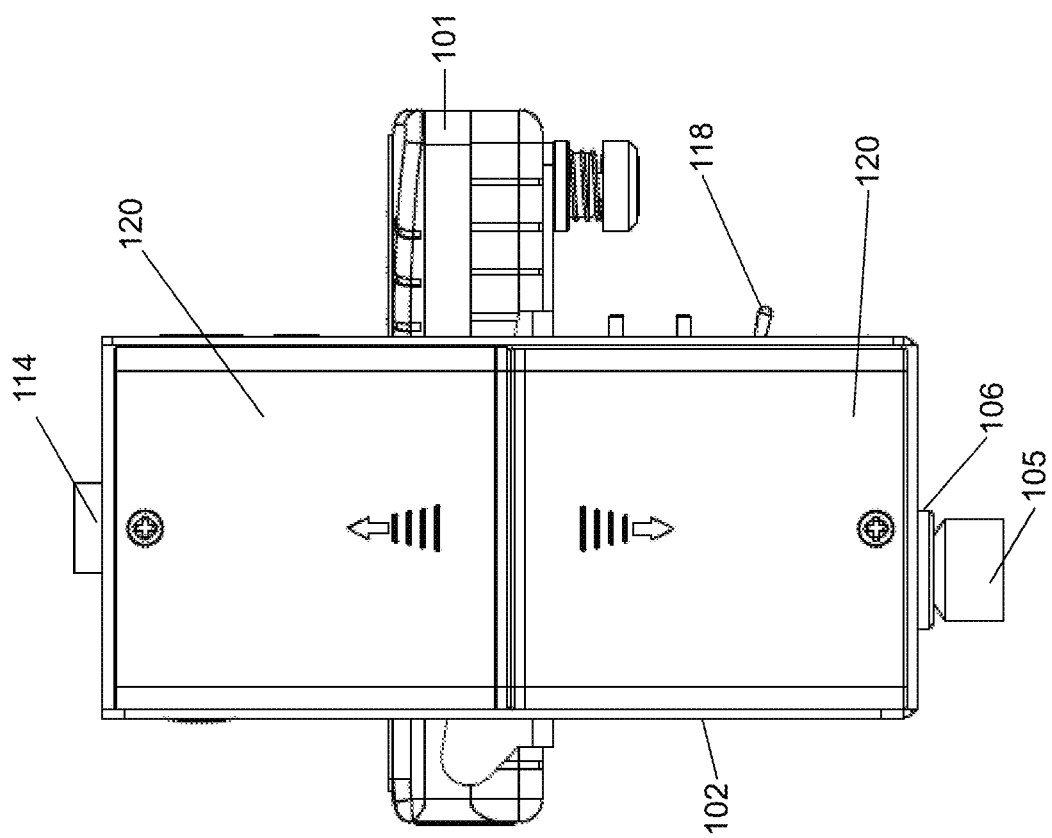
Figure 6B:
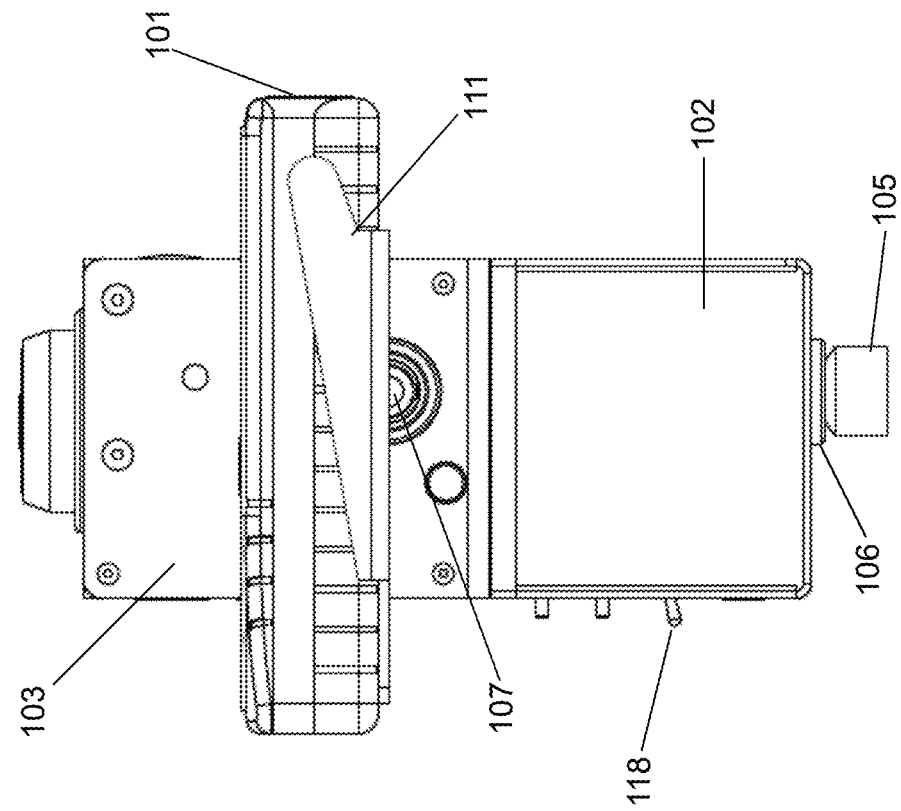
FIG. 6b is a right side elevation of the measurement tool shown in FIG. 1b.
Figure 6A:
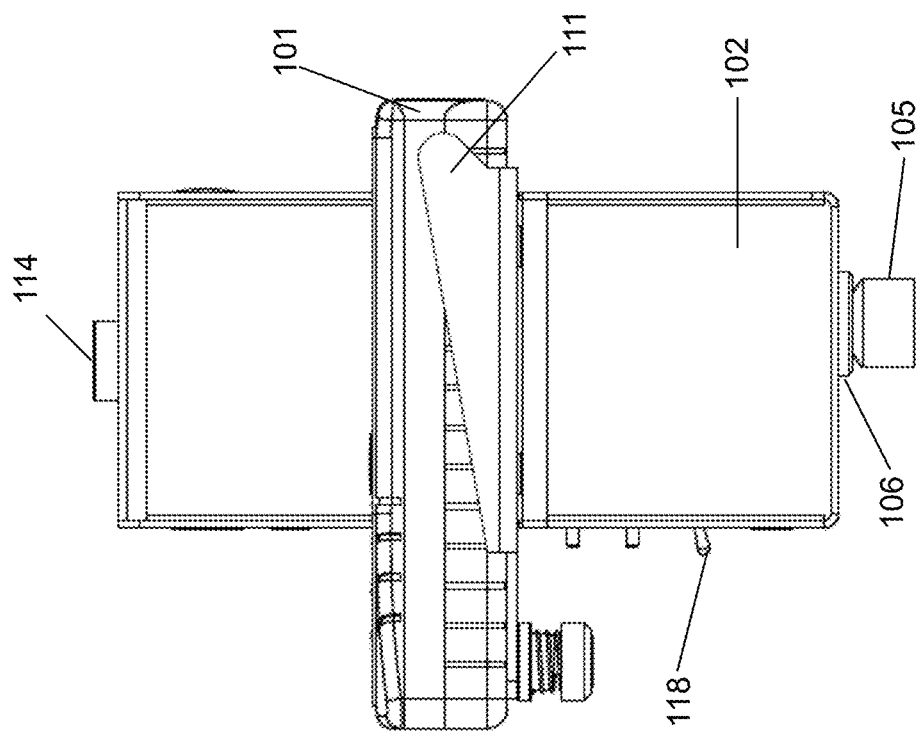
Figure 7A:
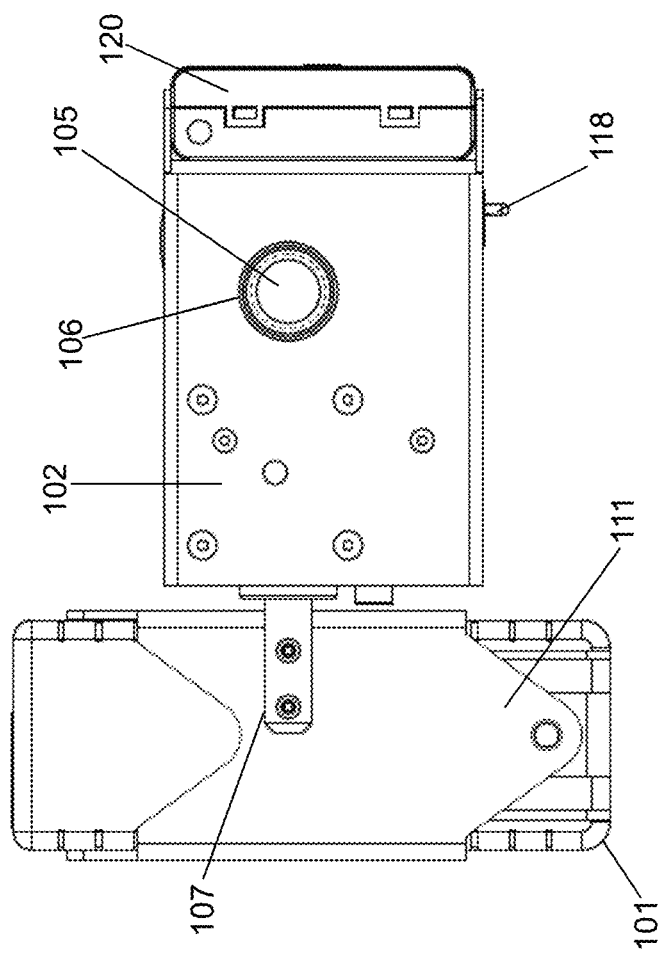
Figure 7B:
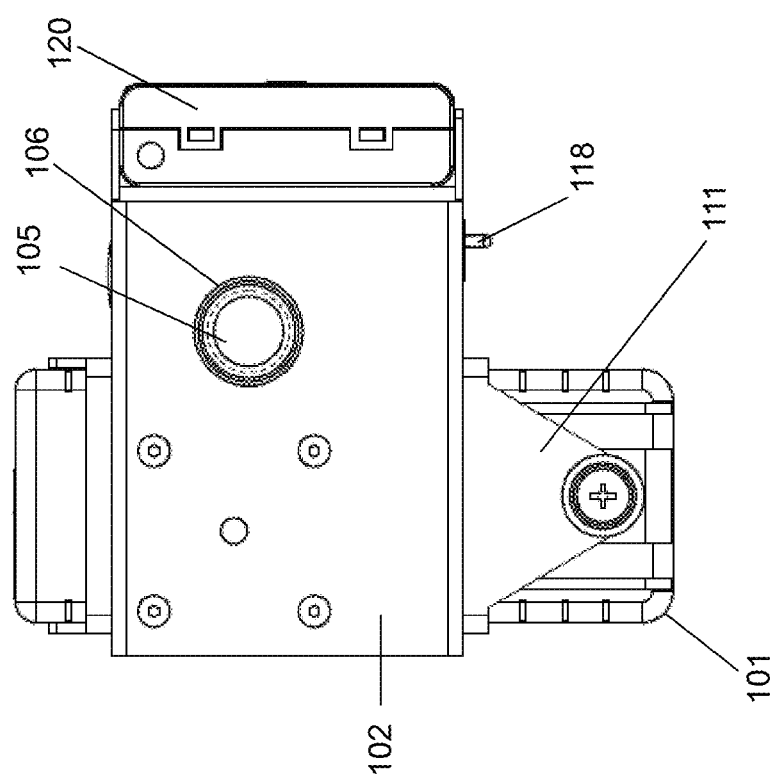
FIG. 7b is a lower elevation of the measurement tool shown in FIG. 1b.
Figure 8B:
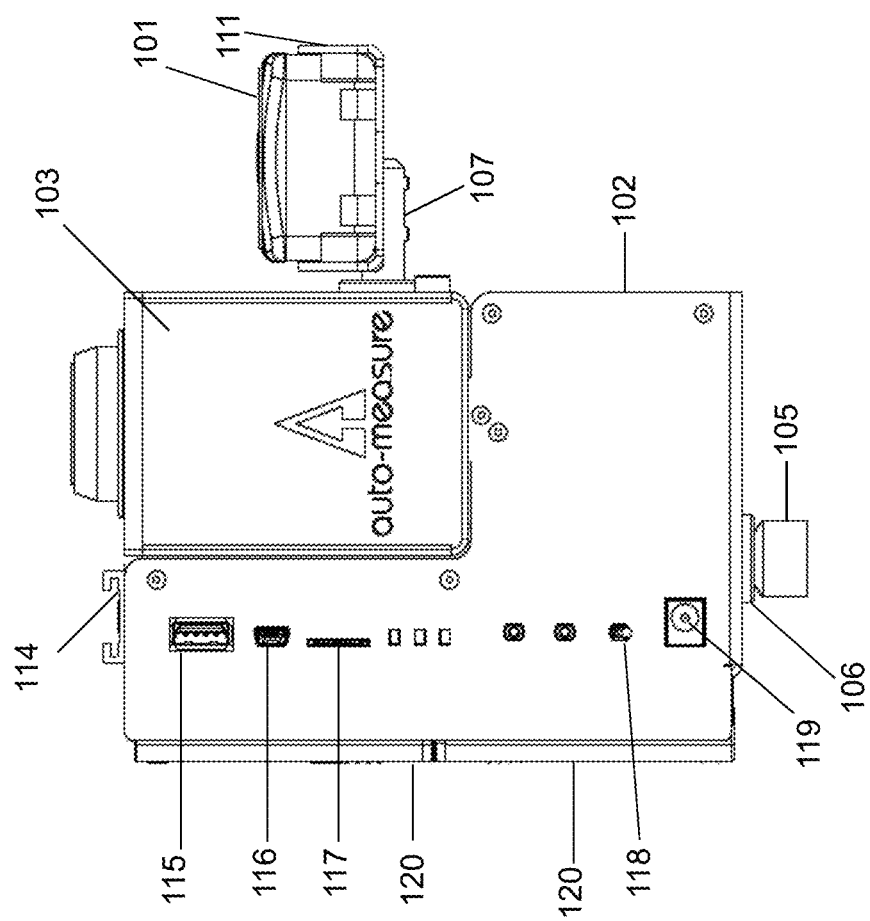
FIG. 8b is a rear elevation of the measurement tool shown in FIG. 1b.
Figure 8A:
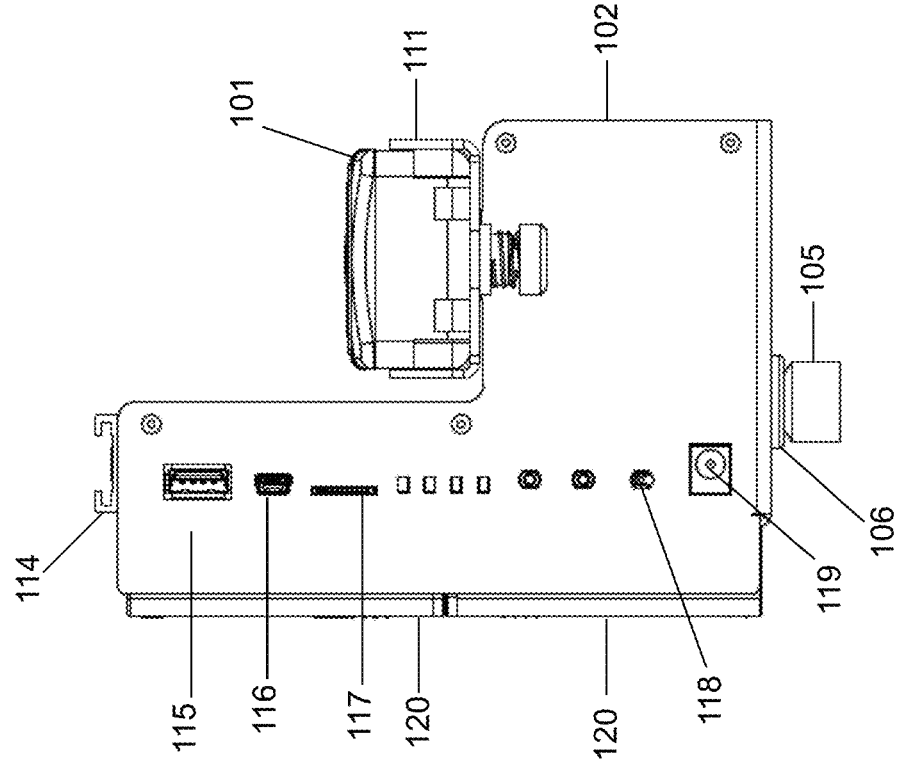

A measurement tool is illustrated in FIGS. 1 to 9. The measurement tool 100, 200 is configured to survey a building having a plurality of rooms by taking individual room measurements. The room measurements captured by the tool can be combined into a building model using a compatible modelling system.

The room measurements may define a cross-section of each room at a prescribed height or a three dimensional representation of a room depending on the measurement tools configuration and settings. The measurement tool 100 illustrated in FIGS. 1a to 8a is configured to capture a horizontal room cross-section (such as a 'floor plan'). The measurement tool 200 illustrated in FIGS. 1b to 8b is configured to capture a three dimensional room representation. The capabilities and configuration of the illustrated measurement tool embodiments are elaborated later in this specification.

The measurement tool 100 illustrated in FIGS. 1a to 8a has a spatial sensor 101 that maps room boundaries. The illustrated spatial sensor 101 is an optical distance meter that determines the distance between the tool and an object (such as a wall or door defining a room boundary) using a concentrated beam of light. Light is emitted through a transparent cover 131 in a front face 130 of the meter 101. Distance measurements captured by the tool 100, 200 are calibrated to the front face 130 of the distance meter 101.

The distance meter 101 illustrated in the drawings has a modular housing, dedicated interface 135, user controls 136 and battery power supply (not shown). These features enable the distance meter 101 to be operated manually (handheld) by a user. The distance meter 101 also ideally has a wireless interface (such as Bluetooth) that facilitates communication with other wireless systems for remote operation and data transfer.

The distance meter 101 is physically coupled to a base module 102. The illustrated base module 102 has a generally 'L-shaped' housing, with a level foundation and an elongate side section. The distance meter 101 is supported on a top surface of the foundation in the embodiment illustrated in FIG. 1a. A mounting bracket 111 physically couples the distance meter housing to the base module 102. The distance meter 101 communicates with the base module 102 through a wireless interface.

The spatial sensor 101 may be integrated with the base module 102 in some embodiments (not shown). This arrangement simplifies system communications and dispenses with some of the auxiliary attributes of the spatial sensor 101 (such as the meter housing, interface 135 and control 136) that enable the illustrated distance meter 101 to be operated manually. However, integrating the spatial sensor 101 and the base module 102 reduces the modularity of the measurement tool 100, 200 and may prohibit some of the modifications to the base module 102 disclosed later in this specification.

The base module 102 is mounted to a support shaft 105 (shown in FIGS. 3, 5, 6, 7, 8 and 9). The shaft 105 supports the base module 102 above the ground (or another support surface). An electric drive (not shown in the drawings) couples the base module 102 to the support shaft 105. The electrical drive is housed within the base module 102.

The support shaft 105 and the electric drive are preferably coupled by a suitable gearbox. An auxiliary coupling (or couples) 106 may also be disposed between the support shaft 105 and the gearbox to allow the base module 102 and shaft 105 to be disconnected.

The electric drive rotates the base module 102 about the support shaft 105 when activated. This drive arrangement gives the base module 102 a single degree of rotational freedom about an upright axis defined by the support shaft 105. The base module is capable of capturing measurements within a single horizontal plane utilising this drive arrangement. The horizontal capture plane is defined by the beam of concentrated light emitted by the distance meter 101 as the base module 102 rotates about the support shaft 105.

It is possible to moderate the height of the measurement plane by adjusting the length of the support shaft 105. A particular measurement height may be desirable for certain applications. For example, floor plans are typically generated at a height of 4 feet from the ground.

The base module 102 incorporates a camera 104. The illustrated camera 104 is integrated with the base module 102. The lens of the camera 104 is arranged generally parallel with the reference surface 130 of the distance meter 101. Both the distance meter 101 and the camera 104 project from a front face of the base module 102 in generally the same direction so that they capture a similar perspective of the environment being measured. A 'hot shoe' 114 is disposed adjacent the camera 104. The 'hot shoe' 114 enables a flash to be used with the camera 104.

The illustrated base module 102 accommodates two batteries 120. The batteries 120 engage with a slide mounting disposed on the elongate side of the L-shaped base module 102. The batteries supply power for regular operation of the measurement tool 100, 200.

A power coupling 119 is disposed in the rear face of the illustrated base module 102. The power coupling 119 enables the base module 102 to be connected to a mains power outlet using a suitable power adaptor. Power received through the power coupling 119 may be used as an alternate power supply to operate the base module 102.

The base module 102 ideally has integrated non-volatile memory that can store images and measurements captured by the camera 104 and the spatial sensor 101 respectively. Data stored in integrated memory within the base module 102 is ideally downloaded to a processing system (such as a general purpose computing system with compatible modelling software) using a standard communication protocol such as Bluetooth or USB.

The illustrated base module 102 incorporates a data communications port 115. The port 115 receives an auxiliary interface (such as a cable, memory stick or wireless adaptor) that facilitates data transfer between the base module 102 and a computing system (such as a personal computer). The port 115 ideally allows a user to download captured measurements and images, adjust system settings, retrieve operational data and perform other system takes. The illustrated communications port 115 is a standard-A USB port. The port 115 is accessible from a rear surface (shown in FIGS. 2 and 8) of the base module 102.

The base module 102 also incorporates an extension interface 117. The illustrated extension interface 117 is a secure digital (SD) slot. The extension interface 117 may receive a flash memory card to either augment the base modules integrated memory or redundantly backup saved data. The extension interface 117 may also supplement other system functions, such as providing an alternative wireless interface for a compatible SD wifi card. The illustrated slot 117 is disposed below the communications interface in the rear face of the base module 107.

A general purpose I/O port 116 is disposed adjacent the extension interface 117 and communications port 115 in the rear face of the base module. The illustrated I/O port 116 is a USB mini-B port. The port 116 provides another interface that may be used for monitoring, maintenance and other auxillary functions (such as firmware upgrades).

Figure 9:
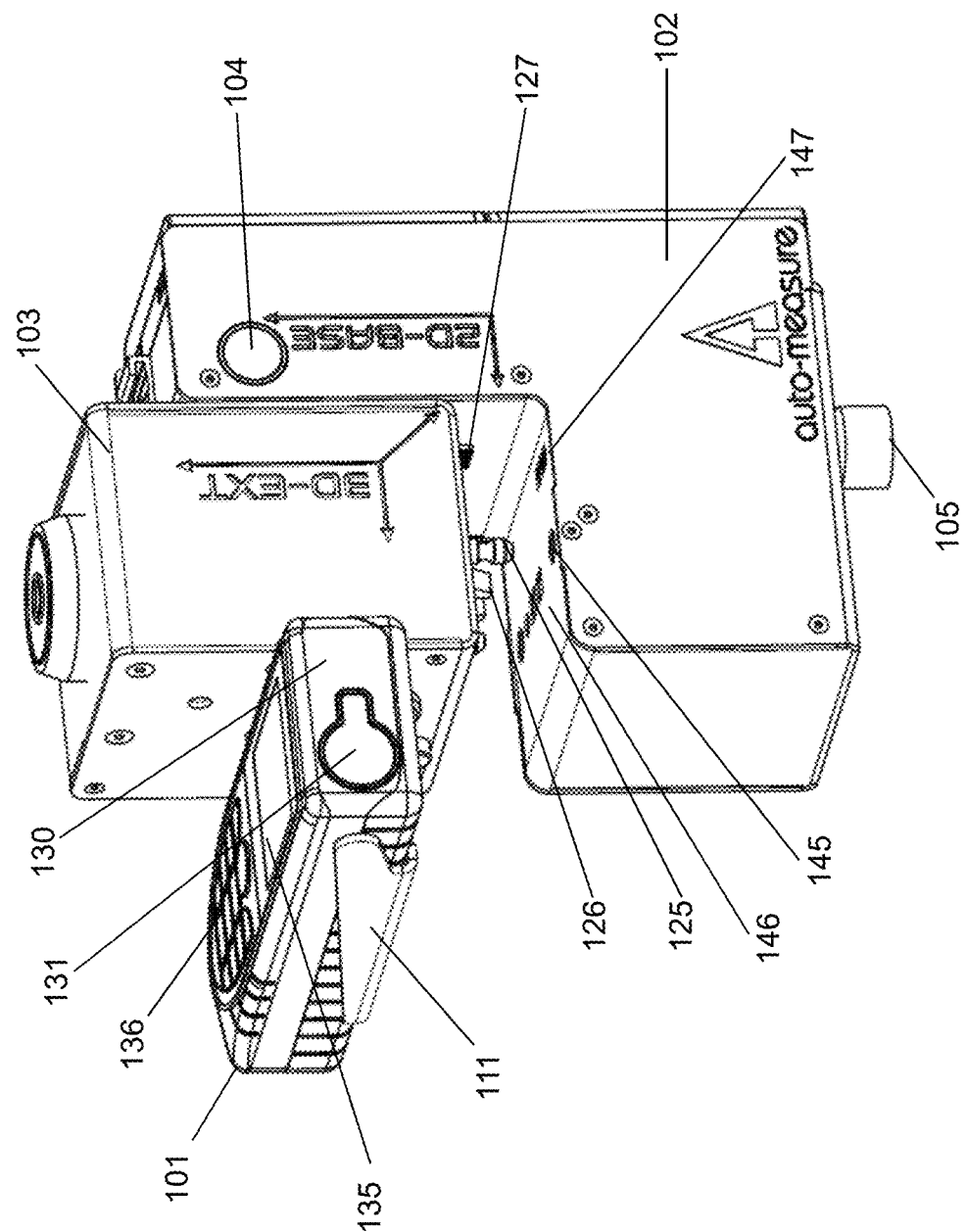
FIG. 9 is a perspective view of the measurement tool shown in FIG. 1b illustrating how the motorised extension module engages with the motorised base.
Figure 10:
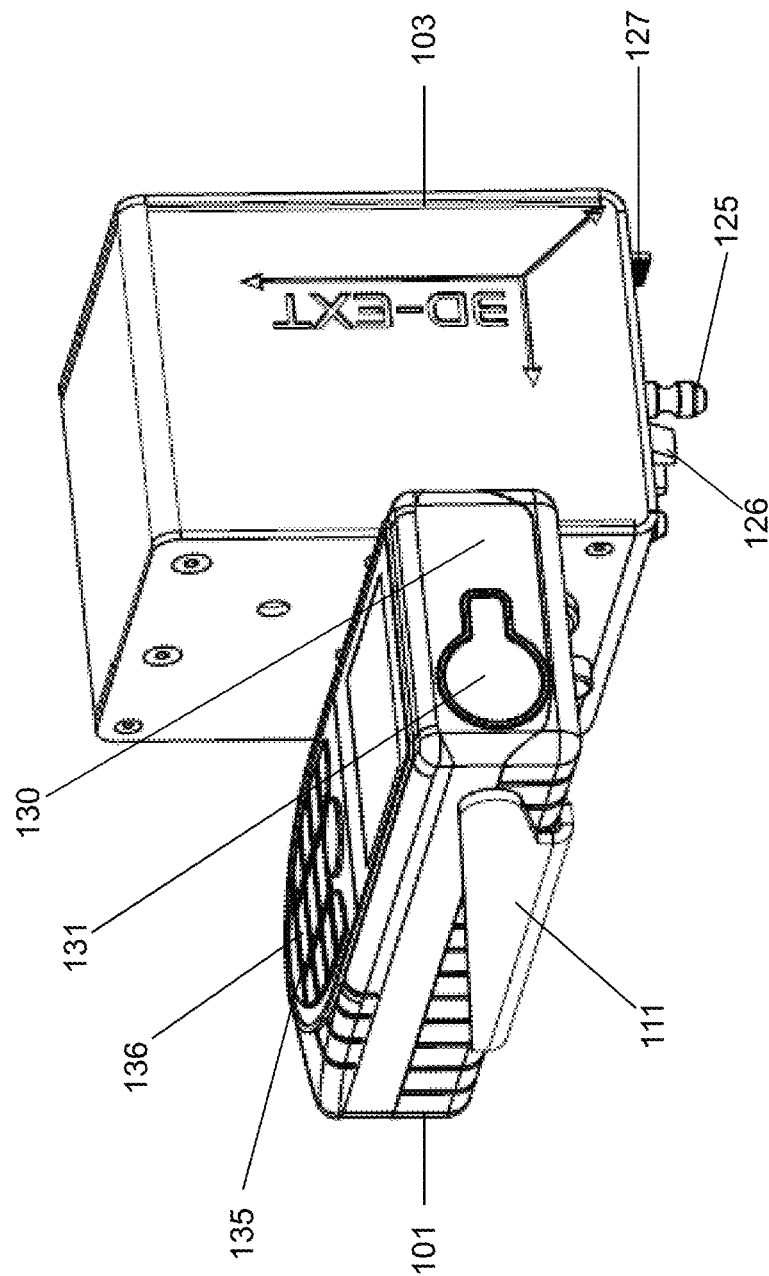
FIG. 10 is a front perspective view of the motorised extension module shown in FIG. 1b, coupled to a distance meter.
Figure 11:
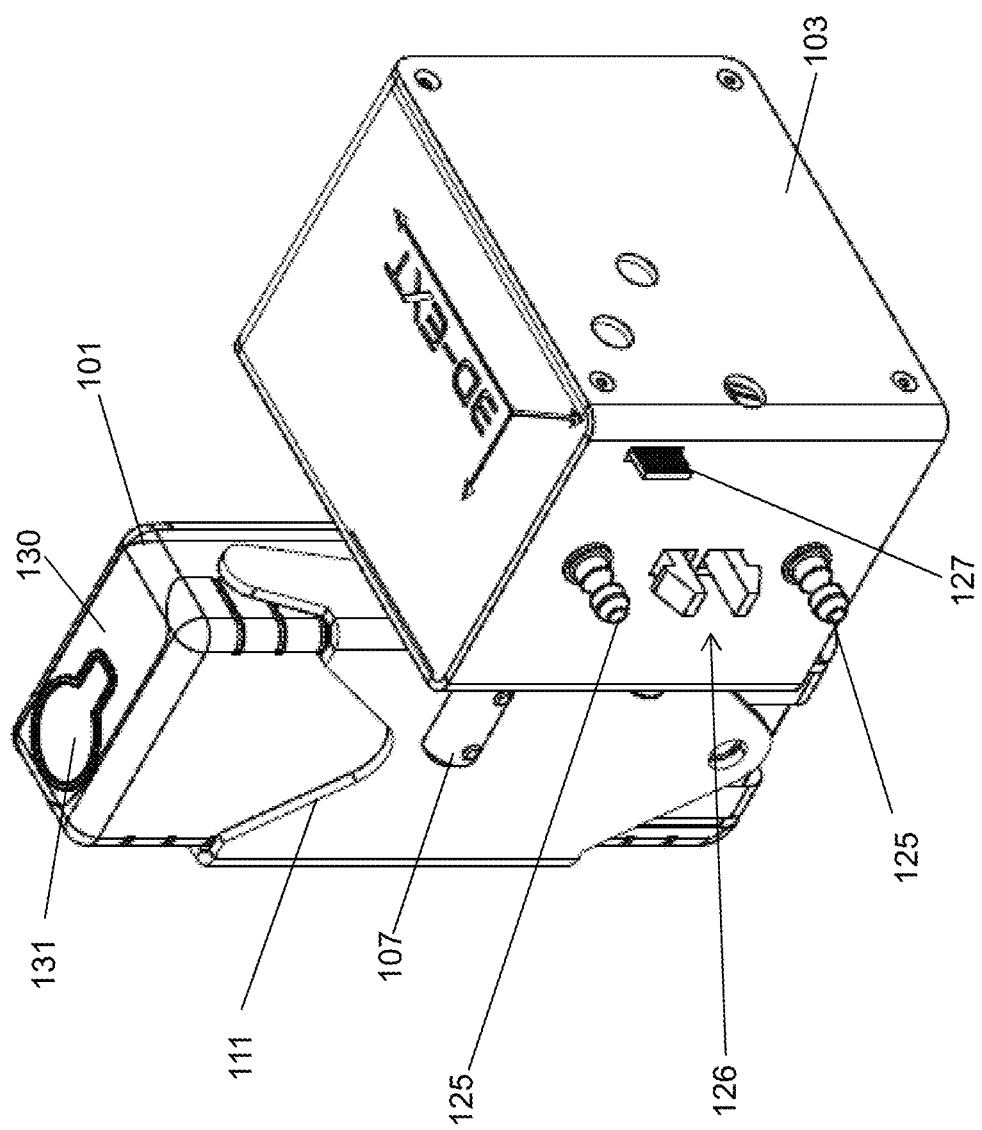
FIG. 11 is a lower perspective view of the motorised extension module and distance meter shown in FIG. 10.

An extension module for the measurement tool 100 (illustrated in FIGS. 1a to 8a) is shown in FIGS. 10 and 11. The extension module 103 engages with the base module 102 as illustrated in FIG. 9. The extended measurement tool 200 (comprising the base module 102 and the extension module 103) is illustrated in FIGS. 1b to 8b.

The extension module 103 expands the surveying capabilities of the base module 102 by increasing the rotational freedom of the spatial sensor 101. The spatial sensor 101 mounts to a drive shaft 107 that extends from the side of the extension module 103. The drive shaft 107 is coupled to an electric drive (not shown) that is housed within the extension module 103. The mounting bracket 111 is fastened to the drive shaft 107 of the extension module 103 in the illustrated embodiment. Ideally, a suitable gearbox is disposed between the drive shaft 107 and the extension module electric drive.

The electric drive rotates the spatial sensor 101 about a generally horizontal axis that is defined by the drive shaft 107. Ideally, the spatial sensor 101 forms a wireless communications link with the base module 102 and incorporates an integrated battery so that the movement of the sensor 101 is not inhibited by physical couplings (such as a wired connection). The drive shaft 107 and the corresponding axis of rotation are disposed transverse to the support shaft 105 (the upright axis that the base module 102 rotates about). The combined drive arrangement of the extension module 103 and the base unit 102 gives the extended measurement tool 200 two degrees of rotational freedom. This enables the spatial sensor 101 to capture measurements defining a three dimensional environment.

The extension module 103 engages with the base module foundation. The base module 102 communicates with the extension module 103 through a hardware communication link in the illustrated embodiment. The communication link is established by reciprocal circuit connectors when the extension module 103 is engaged with the base module 102. The illustrated circuit connectors comprise a plug 127 and a reciprocal port 147 associated with the extension module 103 and base module 102 respectively. Power is also transferred from the base module 102 to the extension module 103 through the hardware link (plug 127 and port 147) in the illustrated embodiment. An auxiliary power coupling may be used in some embodiments (particularly when the communication link between the base module 102 and extension module is wireless).

A mechanical interface aligns the hardware components of the communication link and retains the extension module in engagement with the base module. The illustrated mechanical interface comprises a pair of dome fasteners (domes 125 and sockets 145) and a 'snap lock' connection (prongs 126 and sockets 146). The dome fasteners and 'snap lock' connection retain the extension module 103 in close proximity to the base module 102 so that the physical connection between the hardware components of the communications link (plug 127 and port 147) is maintained.

The snap lock connection depicted in the drawings comprises a pair of spaced prongs 126 that project from the underside of the extension module 103. The prongs 126 are disposed between the domes 125 of the respective dome fasteners. The prongs 126 and domes 125 engage with complimentary sockets 146, 145 disposed in the base module 102 to lock the extension module 103 in position.

A measurement control system (not shown) regulates operation of the measurement tool 100, 200. The measurement control system is housed within the base module 102. The communications port 115, memory extension interface 117, I/O port 116, spatial sensor 101 and integrated system memory preferably all interface with the measurement control system. The control system also ideally communicates with a wireless interface (not shown) that is housed within the base module. The wireless interface connects the measurement control system with the spatial sensor 101. The spatial sensor 101 has a complimentary wireless interface that enables the base module 102 and spatial sensor 101 to form a communication gateway. The base module wireless interface may also connect the measurement tool 100, 200 to other wireless devices (such as a tablet or personal computer).

The base module control system communicates measurement instructions to the spatial sensor 101 across the wireless communication gateway. These instructions may include directions to capture a distance measurement, verify a previous measurement or manage dedicated local memory. The spatial sensor 101 may also use the wireless gateway to communicate spatial measurements to the base module 102. Spatial measurements may be transmitted individually as they are captured or accumulated locally in dedicated memory (within the spatial sensor 101) and transmitted in a batch process to the base module 102.

The base module 102 may incorporate an orientation sensor (preferably a digital compass) that determines the absolute orientation of the measurement tool 100, 200 as it rotates about the support shaft 105. This enables the measurement tool 100, 200 to identify the orientation of each spatial measurement (with respect to an absolute reference) as the measurements are captured. The orientation sensor is preferably interfaced with the base module control system. The control system may encode each measurement captured by the spatial sensor 101 with a metadata orientation stamp.

The base module control system may also encode each image captured by the camera 104 with an orientation stamp. This enables an associated modelling tool to determine the relative position of each measurement within a corresponding image.

The base module 102 or extension module 103 may also house a positioning system (such as GPS) that determines the absolute geographical position of the measurement tool 100, 200. The geographical position determined by the positioning system is ideally communicated to the base module control system so that the measurements for a building may be stamped with a geographical identifier.

The orientation sensor and the positioning system may be integrated within the measurement tool 100, 200 or supplied as auxiliary components.

The extended measurement tool 200 ideally incorporates a rotation sensor (such as a rotational encoder) that records the rotational position of the spatial sensor 101. The rotation sensor maybe implemented in a software module that determines the position of the spatial sensor 101 from the output of the base module control system or comprise a hardware component that is coupled the drive shaft 107. The base module control system is ideally interfaced to the rotation sensor so that each measurement maybe stamped with a rotational identifier that specifies the position of the spatial sensor 101 when the measurement was captured. The stamp preferably defines a rotational offset from the default 'horizontal' spatial sensor 101 position illustrated in the drawings.

The measurement control system preferably includes a software interface that allows system settings to be adjusted by a technician or user. The control system interface for the illustrated measurement tool 100, 200 is presented to a user when an auxillary device (such as a laptop or tablet computer) is connected to the base module 102. The connection may be established through a wireless interface or the communications port 115.

The user may adjust measurement setting (such as the number of measurement points recorded for each degree of rotation), alter operational settings (such as data transfer procedures) and remotely operate the measurement tool 100, 200 through the control system interface. The interface may also enable a user to correct system faults, update the system firmware and perform a software restart. The illustrated base module 102 incorporates a hardware power switch that enables a user to control the state (on/off) of the measurement tool 100, 200 without accessing the control system interface.

The measurement tool 100, 200 illustrated in FIGS. 1 to 11 forms part of a building modelling system. The modelling system includes a modelling tool that generates a graphic representation of a building. The modelling tool presented in this specification is a software package that generates a model of a structure (such as a building) from individual room models. The software uses openings shared by adjoining rooms (and openings in the structure exterior where applicable) to determine the room layout within the structure. The modelling tool ideally constructs a computer model of the structure from measurements of individual rooms captured by the measurement tool 100, 200.

The modelling tool has a measurement module that receives room measurements and stores the measurements in a computer memory. The measurement module preferably has a measurement interface that receives the room measurements. Each room measurement defines the boundaries of a room within that building. The modelling tool receives a plurality of room measurements for each building that is being mapped. The room measurements for a building are ideally linked (by folder structure, metadata or another association) within the moduling tool.

The measurement module may interface with the measurement tool (generally through an interfacing module) to automatically import room measurements and/or enable a user to manually enter room measurements through a suitable user interface.

The modelling tool may also incorporate an image interface that receives of a plurality of images for a measured room. The image interface stores the received images in computer memory so that the images can be readily accessed by the modelling tool. The modelling tool ideally constructs a panoramic room image from the individual room images received through the image interface.

Figure 16A:
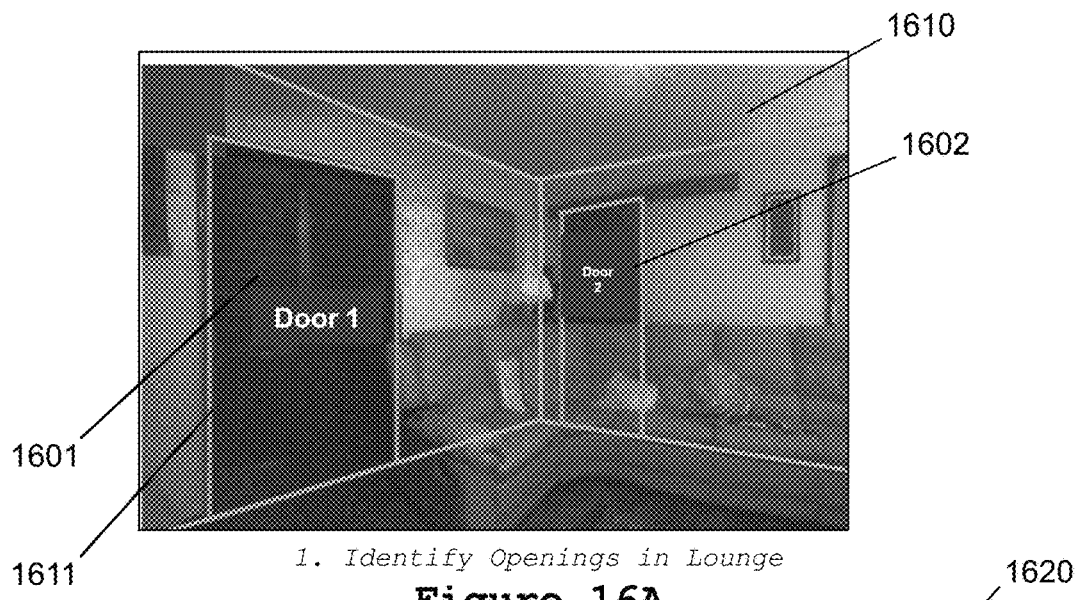
Figure 16B:
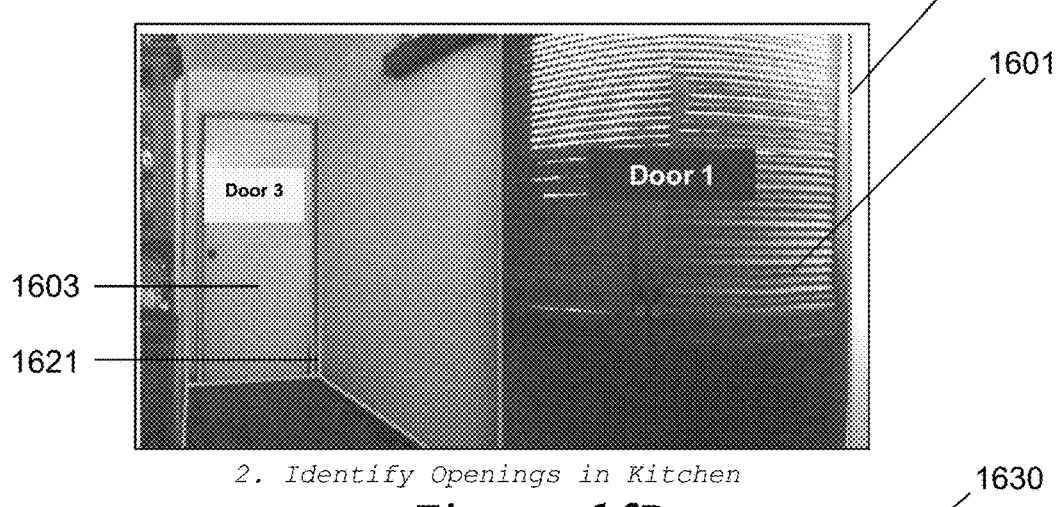
FIG. 16b is a composite room model that depicts a portion of the kitchen illustrated in FIG. 14b.
Figure 16C:
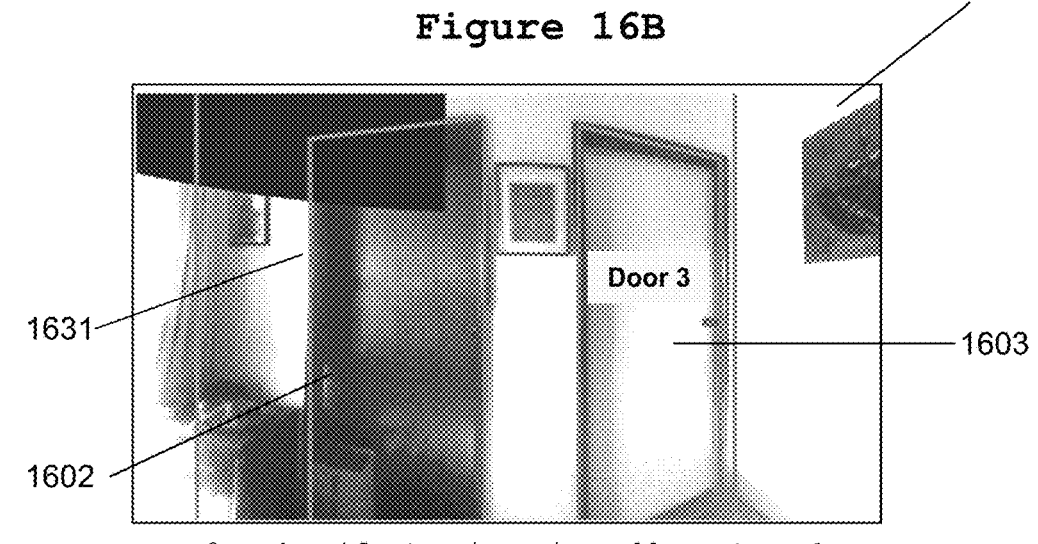
FIG. 16c is a composite room model that depicts a portion of the hallway illustrated in FIG. 14c.

The individual measurements for a room may be interlaced with the corresponding room image when both the measurements and images are encoded with an orientation stamp. The orientation stamp enables the modelling tool to construct a composite room model by superimposing the individual room measurements over the panoramic room image. A composite room model is illustrated in FIGS. 16*a* to 16*c*. Some of the measurements have been interconnected to form a wireframe room representation in the illustrated composite model.

Figure 12:
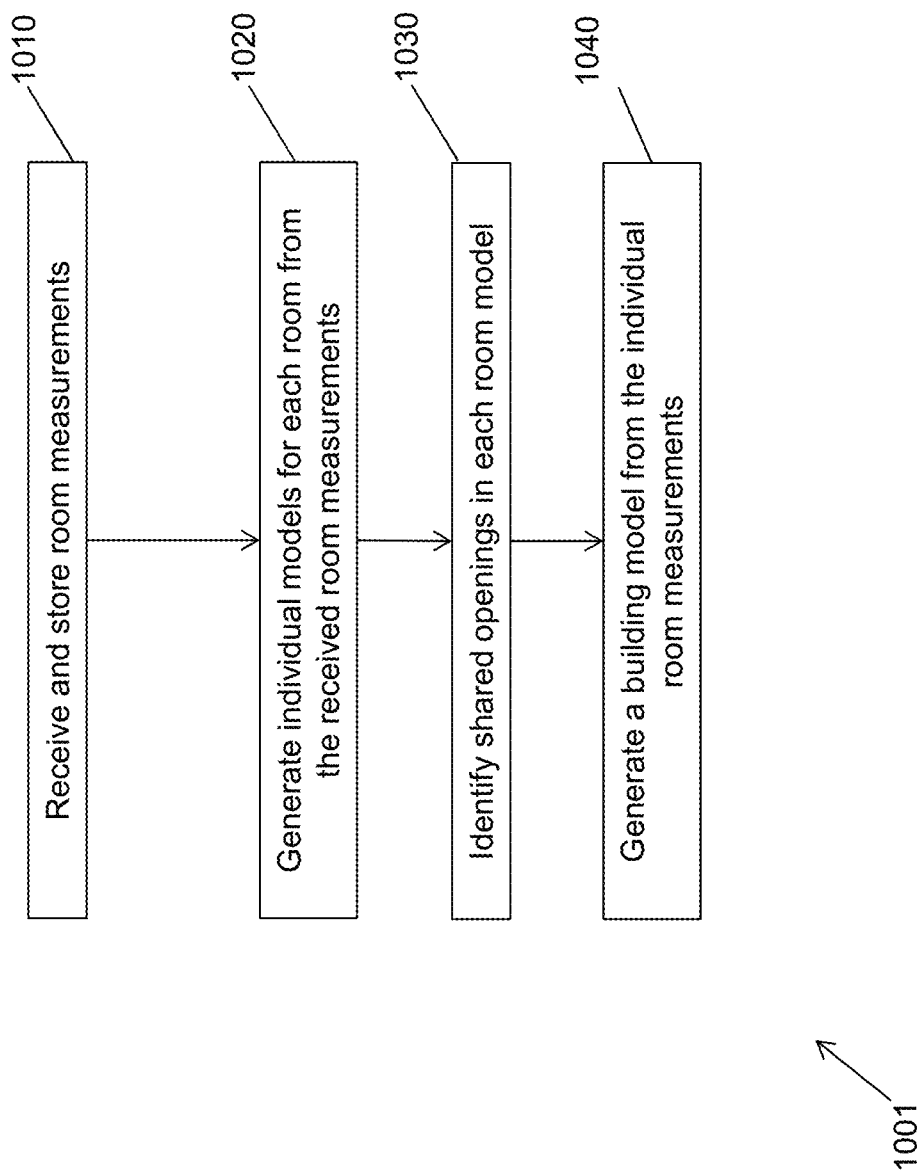
FIG. 12 is a flow chart showing a method of constructing a building model from individual room measurements.

An exemplary modelling method is presented in a flow chart in FIG. 12. The flow chart 1001 demonstrates several steps that a modelling tool may implement to generate a building model from individual room measurements. The modelling process initiates in step 1010. The modelling tool receives a plurality of room measurements and stores the room measurements in computer memory. The room measurements define the boundaries of rooms within a building. Each room measurement is ideally linked to a corresponding room so that the modelling tool can discern which room each measurement is derived from. The link may be established by a data structure, digital file structure, metadata tag or another suitable identification mechanism.

Figures 14A, 14B, 14C:
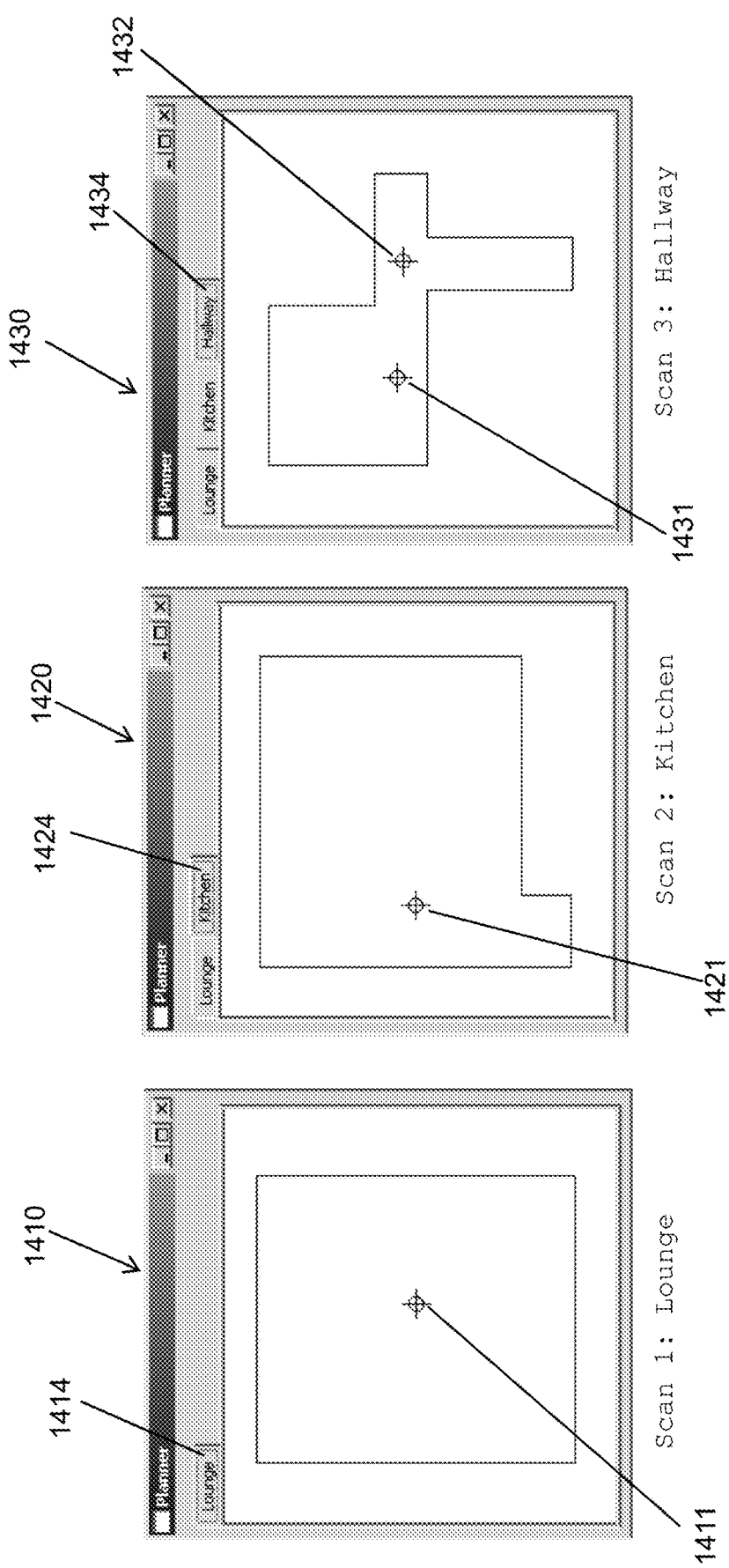
FIG. 14a is a screen shot of a user interface displaying a room model for the lounge of a residential building.
FIG. 14b is another screen shot of the user interface illustrated in FIG. 14a displaying a room model for the kitchen of the residential building.
FIG. 14c is a screen shot of the user interface illustrated in FIGS. 14a and 14b displaying a room model for the hallway of the residential building.

The modelling tool ideally incorporates a modelling module that uses the stored room measurements to generate individual room models. This is represented by step 1020 of the flowchart 1001 illustrated in FIG. 12. Three exemplary two-dimensional room models are illustrated in FIGS. 14a to 14c. The room models are depicted in a user interface provided by the modelling tool. The room models represent a floor plan (a two dimensional room models) of the lounge 1410, kitchen 1420 and hallway 1430 of a residential building. The interface presents the models to a user during the modelling process. The room models are depicted independently in FIGS. 14 to 14c. FIGS. 18a to 18c depict the construction of a structure model (such as a building model) from the individual room models illustrated in FIGS. 14a to 14c. The construction of the structure model is depicted in a similar user interface which is also provided by the modelling tool.

Each room model 1410, 1420, 1430 is positioned with respect to an absolute frame of reference. The frame of reference may be determined from an orientation stamp associated with the corresponding room measurements. This enables the modelling tool to position the room models in a relative orientation that reflects the position of the respective rooms within the mapped building. The capture points 1411, 1421, 1431, 1432 for each room are displayed in the respective room models. Each capture point identifies the measurement tool 100, 200 position used to survey the respective room. The modelling tool determines the survey position of the measurement tool 100, 200 (i.e. the capture point) from the measurements captured for the room.

Two capture points 1431, 1432 have been used to map the hallway illustrated in FIG. 14c. The shape of the hallway 1430 complicates the mapping process as there is not a single vantage point with a 'line of sight' to each room boundary. At least two capture points are required to survey the illustrated hallway.

The modelling module combines the measurements from each capture point 1431, 1432 to generate a single room model 1430 for the hallway. The hallway measurements from both capture points 1431, 1432 are encoded with an absolute orientation stamp that is derived from the base module orientation sensor. The measurement tool uses the orientation stamp to position the corresponding measurement within an absolute a frame of reference. The position of each measurement is calibrated to the respective capture point 1431, 1432 to define the hallway boundaries. The measurements may be linked to a capture point by a suitable file structure or metadata encoded with the measurements.

The room models illustrated in FIGS. 14a to 14c are a two dimensional graphic reproduction of three rooms from the same building. Each room is allocated a separate tab 1414, 1424, 1434 within a building interface. The room models depict the shape of each room. The room shape is defined by the room boundaries (typically walls and doors). Room openings (typically doors and windows) are not identified for the room models illustrated in FIGS. 14a to 14c.

Figure 13:
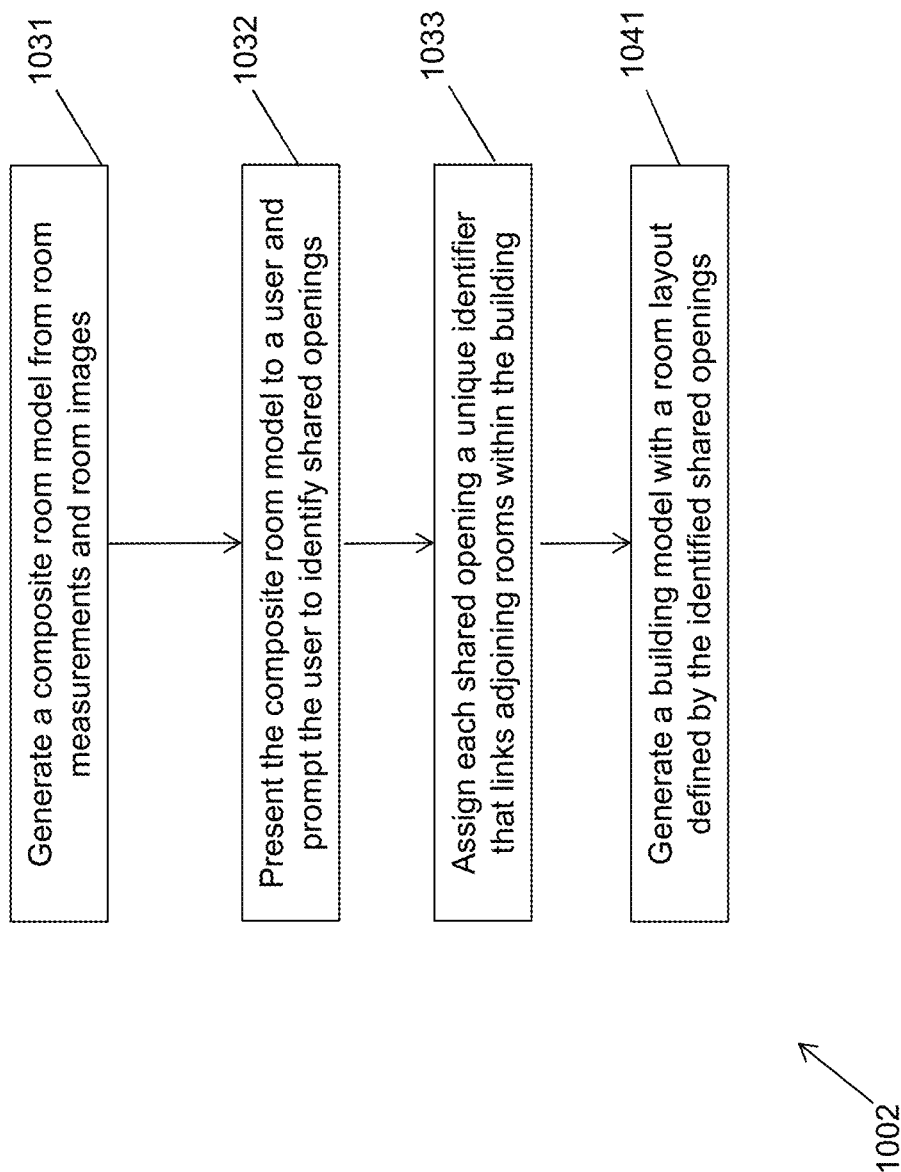
FIG. 13 is a flow chart showing possible sub-steps for the building modelling method illustrated in FIG. 12.

Identifying common openings shared by adjoining rooms within a building is the next step 1030 in the flowchart 1001 illustrated at FIG. 12. The modelling tool may automatically identify potential room openings from changes in a room's boundary that fit a defined profile (such as measurement characteristics that are typically associated with a door frame). The possible openings identified by the modelling tool may need to be verified by a user. A user based identification and/or verification procedure is presented in the flowchart 1002 illustrated in FIG. 13.

The modelling tool initiates the identification and/or verification procedure by constructing a composite room model in step 1031. The composite room model comprises measurements of a room interlaced with a corresponding room image. The individual room measurements may be compiled to form a wire frame representation of the room. Four panoramic wire frame room reproductions (without the corresponding image) are presented in FIGS. 15a to 15d. The panoramic wire frames 1511, 1521, 1531, 1532 have been generated for the room models illustrated in FIGS. 14a to 14c. Each wire frame reproduction has been generated from the perspective of the illustrated capture points 1400, 1421, 1431, 1432. The surfaces defined by the illustrated wireframe representations 1511, 1521, 1531, 1541 have been rendered in FIGS. 15a to 15d and the room openings are not identified.

Another set of wire frame room reproductions are illustrated in FIGS. 16a to 16c interlaced with images of the corresponding rooms. Each wire frame reproductions 1611, 1621, 1631 is superimposed over the respective room image 1610, 1620, 1630 to form a composite room model. The modelling tool ideally presents each composite room model to a user and prompts the user to identify and/or verify the openings in the rooms boundary wall (such as doors).

The modelling module incorporates a user interface that facilitates identification of common opening shared by adjoining rooms. The interface enables a user to allocate each opening a unique identifier (represented by step 1032 of the flow chart 1002 illustrated in FIG. 13). The user interface ideally presents a composite room model or a wireframe representation of the room to the user and prompts the user to select the shared room openings depicted in the model. The openings for the rooms illustrated in FIGS. 16a to 16c are identified and labeled in the respective composite room models.

The composite room models for a building may be constructed in an equi-rectangular format (the format of the wireframe reproductions illustrated in FIGS. 15a to 15d). An equi-rectangular room image may be constructed by stitching a plurality of partial room images together in a room panorama.

The unique identifier allocated to room openings in the room models may be a user defined tag (such as 'kitchen/lounge door'), a numeric identifier (such as 'door 1') or another suitable identifier. The modelling tool receives the user allocated identifiers and assigns them to the corresponding openings within the room models (step 1033 of the flowchart 1002 illustrated in FIG. 13). Shared openings that are represented in more than one composite room model are allocated the same unique identifier in each room reproduction.

Figure 15A:
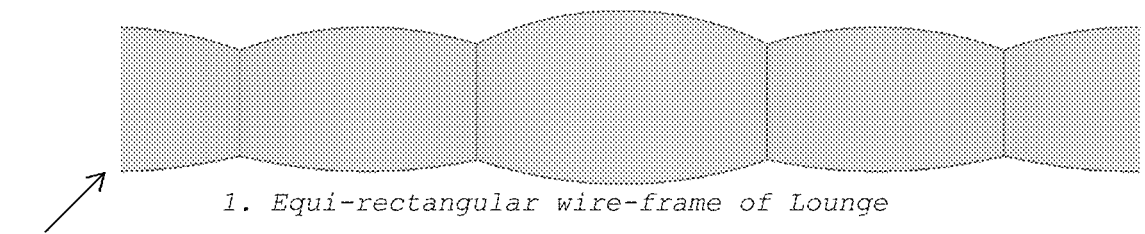
FIG. 15a is a schematic equi-rectangular wire-frame representation of the room model displayed in FIG. 14a generated from the perspective of the illustrated capture point.
Figure 15B:
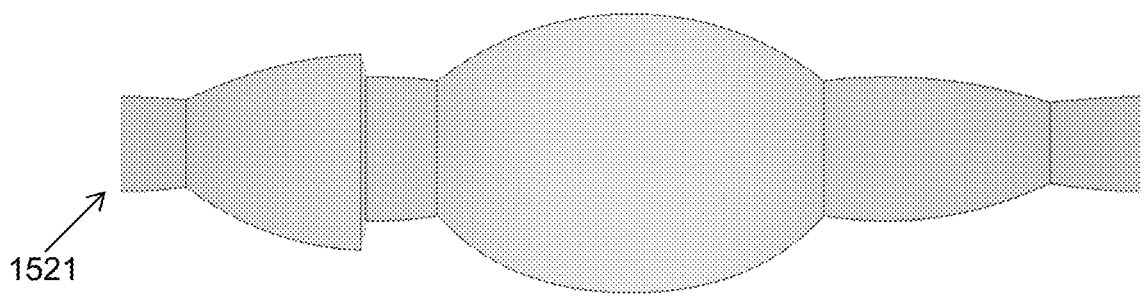
FIG. 15b is a schematic equi-rectangular wire-frame representation of the room model displayed in FIG. 14b generated from the perspective of the illustrated capture point.
Figure 15C:
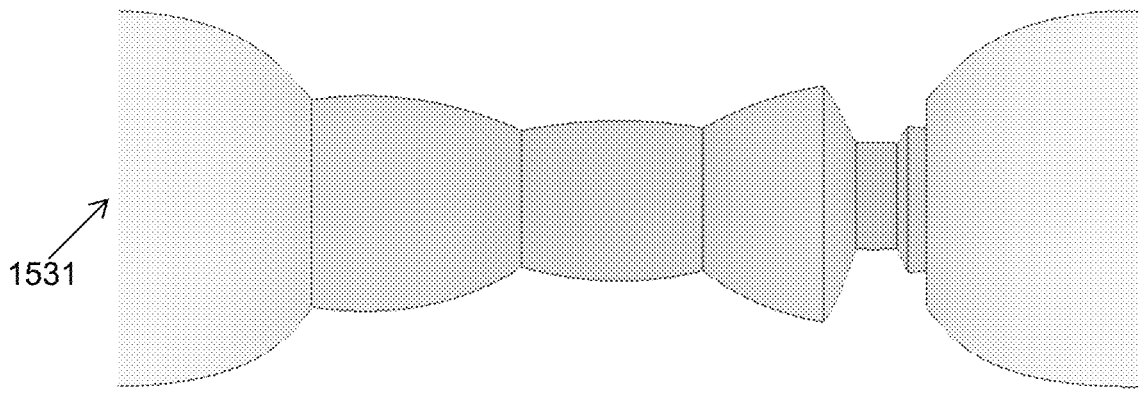
FIG. 15c is a schematic equi-rectangular wire-frame representation of the room model displayed in FIG. 14c generated from the perspective of the left capture point.
Figure 15D:
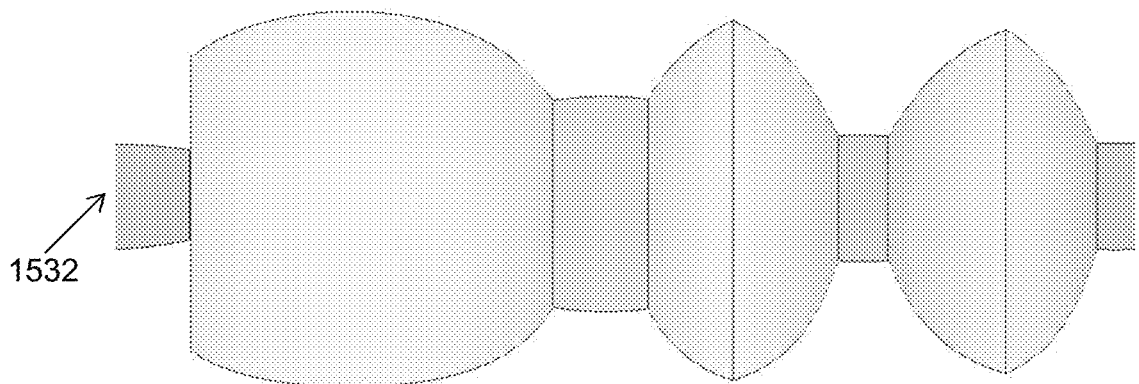
FIG. 15d is a schematic equi-rectangular wire-frame representation of the room model displayed in FIG. 14c generated from the perspective of the right capture point.
Figure 17A:
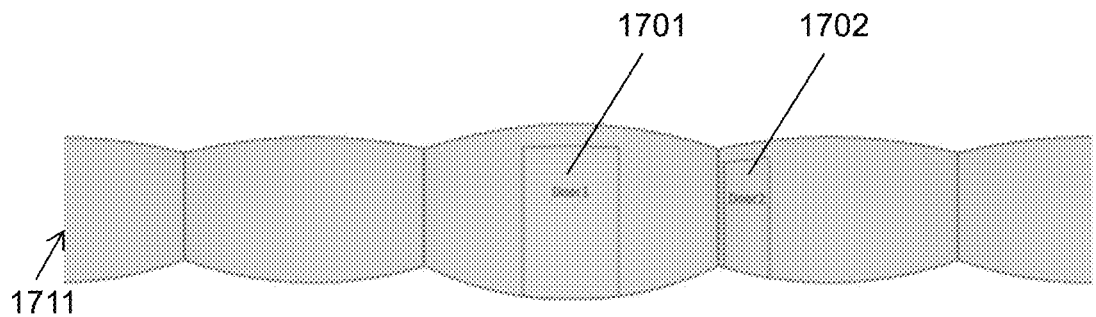
FIG. 17a is a reproduction of the schematic equi-rectangular wire-frame representation depicted in FIG. 15a with the room openings identified.
Figure 17B:
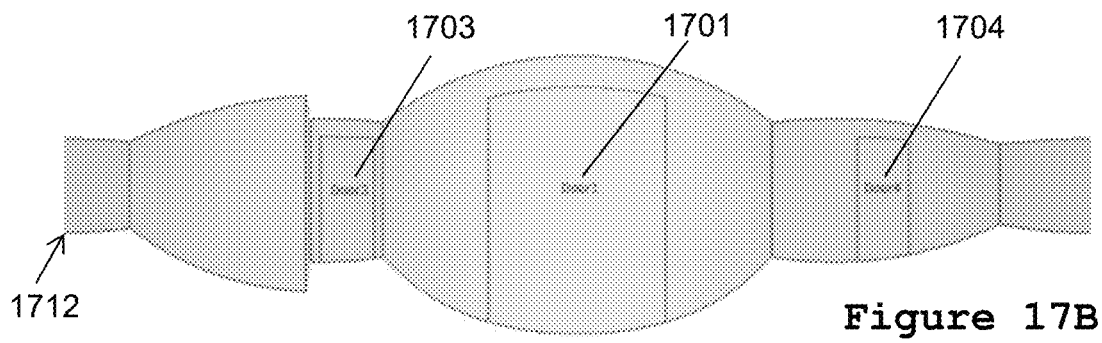
FIG. 17b is a reproduction of the schematic equi-rectangular wire-frame representation depicted in FIG. 15b with the room openings identified.
Figure 17C:
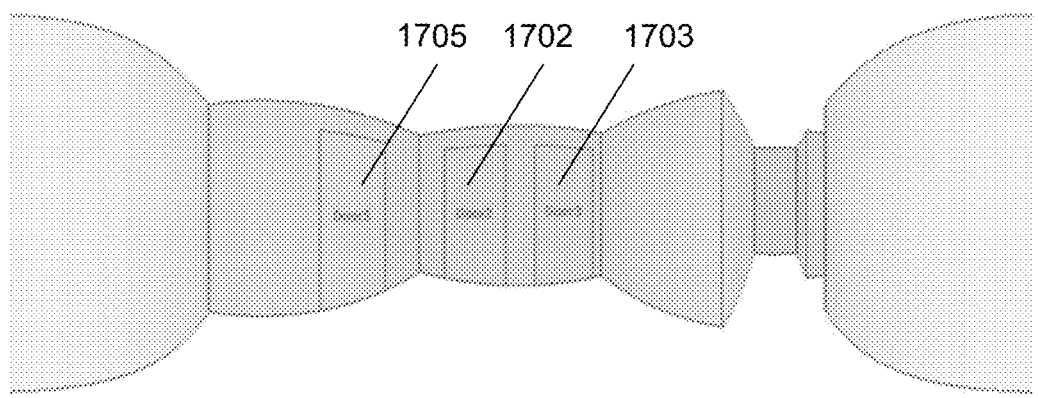
FIG. 17c is a reproduction of the equi-rectangular wire-frame representation depicted in FIG. 15c with the room openings identified.

The wireframe representations 1511, 1521, 1531 illustrated in FIGS. 15a to 15c are reproduced in FIGS. 17a to 17c with the openings of each room identified and labeled. The room openings 1701, 1702, 1703 identified in FIGS.

17a to 17c correspond to the respective openings 1601, 1602, 1603 depicted in the composite room models illustrated in FIGS. 16a to 16c.

The modelling tool uses the unique identifiers assigned to the shared room openings to identify adjoining rooms within a building model. The unique identifiers link the shared openings of adjoining rooms and define room associations within the building. The modelling tool uses the room associations to construct a building model from the individual room models (step 1041 of the flow chart 1002 illustrated in FIG. 13). The building model is constructed by matching the shared openings of room models that represent adjoining rooms within the building. The process is depicted graphically in FIGS. 18a to 18c.

The room models 1410, 1420, 1430 illustrated in FIGS. 14a to 14c are reproduced in FIGS. 18a to 18c with the openings of each room identified. The openings 1801, 1802, 1803, 1804, 1805 illustrated in FIGS. 18a to 18c correspond the respective openings 1701, 1702, 1703, 1704, 1705 depicted in FIGS. 17a to 17c.

The 'lounge' room model 1810 is depicted in FIG. 18a. The illustrated 'lounge' has two doorways 1801, 1802. One of these doorways 1801 is shared with the 'kitchen' room model. The modelling tool uses the common opening 1801 between the lounge and kitchen to determine the layout of these rooms within the building. The association of the 'lounge' and 'kitchen' room models is illustrated in a partial building model 1820 in FIG. 18b.

Both the 'lounge' and the 'kitchen' share an open with the 'hallway'. The shared openings 1802, 1803 are used to associate the 'hallway' room model with the 'lounge' and 'kitchen' room models in the partial building model 1830 illustrated in FIG. 18c. The modelling tool may use the relative positions of shared openings (such as the openings the 'hallway' room model shares with the 'lounge' room model 1802 and 'kitchen' model 1803) to determine the orientation of rooms within a building model in the absence of measured orientation records. Constructing a building model without orientation measurement may require additional user interaction (such as verify the orientation of rooms during construction of the building model).

The modelling tool ideally incorporates a layout module that arranges the individual room modules within the building model. The layout module uses the unique identifiers assigned to each share opening to determine the layout of rooms within the building model.

The modelling tool may also incorporate an exterior modelling module that generates a computer representation of a building's exterior façade. The exterior modelling module produces the exterior façade representations from three dimensional spatial measurements (such as the measurements taken by the extended measurement tool 200 illustrated in FIGS. 1b to 8b).

The exterior modelling module may link the computer generated façade to rooms within the building model using external building openings. The modelling tool ideally assigns a unique identifier to exterior openings in the peripheral rooms models of a building model. The unique identifier links the peripheral rooms to the exterior façade generated by the exterior modelling module.

The modelling tool ideally receives the exterior building measurements through an automated measurement interface. The measurement interface stores the received exterior building measurements in computer memory so that the measurements may be used by the exterior modelling module to generate the exterior façade representation.

A measurement system user interface is illustrated schematically in FIGS. 19a to 19c. The interface enables a user to define the mapping attributes for a room and/or building. The illustrated interface 1901 has three distinct information categories. The respective categories are delimited by corresponding information tabs 1910, 1920, 1930. A user accesses the information categories by selecting the relevant tab. The user interface 1901 preferably connects a user directly to the measurement tool 100, 200 so that the user defined information can be immediately associated with the measurements captured for a building.

Building information is associated with a 'PLACE' tab 1910. The 'PLACE' tab 1910 is illustrated in FIG. 19a. The building information is defined in discrete fields. The information fields may be populated automatically by the modelling system (such as the GPS location illustrated in field 1930) or require user input (such as the building description illustrated in field 1914).

The attributes of a particular survey position are defined in the 'SPACE' tab 1920 illustrated in FIG. 19b. The information entered in the 'SPACE' tab 1920 enables the measurements captured at a particular survey site to be organized and identified. This may occur within the measurement tool or a complimentary modelling tool. The 'SPACE' information recorded for a survey site may be used to link related measurements (such as measurements for the same story of a building) and define general room relations.

The measurement tool settings used to capture a room may be adjusted in the 'SCAN' tab 1930 illustrated in FIG. 19c. The 'SCAN' tab 1930 enables the user to define the measurement tool configuration used to capture each room. The illustrated configuration settings include the scan speed 1933 and scan accuracy 1934 used by the tool to survey a room.

The preferred embodiments of the modelling system (measurement tool and modelling tool) disclosed in this specification are described in relation to buildings. However, the system may also be used to model other structures with defined rooms. Other possible structures include ships and aircraft. The room openings used to determine the layout of rooms within a structure model may include doors, windows and vents. Other defining features that link adjacent rooms may also be used.

This specification describes a modelling system (comprising a measurement tool and modelling tool) with respect to specific embodiments that are illustrated in the drawings. The scope of the claims should not be limited by the preferred embodiments set forth in the examples, but should be given the broadest interpretation consistent with the description as a whole The word "comprise" (and variations such as "comprises" or "comprising") is used in the description and claims in an inclusive sense (i.e. to specify the presence of the stated features but not to preclude the presence or addition of further features), except where the context requires otherwise due to express language or necessary implication Thus, the described system and method may have other elements or steps in various embodiments of the invention. The purpose of the claims is to define the features which make up the invention and not necessarily all features which a working embodiment of the system or method, to which the invention defines, may have. The system or method defined in the claims may therefore include other elements or steps as well as the inventive elements or steps which make up the invention and which are specifically recited in the claims.

What is claimed is:

1. A structure modelling system comprising:
a measurement device configured to survey a structure having a plurality of adjoining rooms, at least a plurality of the adjoining rooms having shared openings, the measurement device having a spatial sensor that maps room boundaries and is arranged to generate measurements of individual rooms; and
a modelling tool that is configured to:
receive the generated measurements of individual rooms, and receive a plurality of images for each individual room and construct a panoramic room image for each individual room, the received measurements and the images being encoded with orientation information,
from the received measurements and the panoramic room images of the individual rooms, generate a composite computer model of each individual room,
enable a user to allocate a unique identifier to each of the openings that are shared by adjoining rooms, the unique identifier thereby defining a room association within the structure, and
use the room associations to determine the layout of rooms, to construct a structure model from the composite computer models of the individual rooms.

2. The system of claim 1 wherein the measurement device comprises an orientation sensor that determines the orientation of each spatial measurement with respect to an absolute reference.

3. The system of claim 1 wherein the measurement device comprises a positioning system that determines a geographical position of the measurement device, the measurement device encoding structure measurements with a geographical stamp that identifies a geographical position of the structure.

4. A computer implemented modelling tool comprising:
a measurement interface that is configured to receive a plurality of room measurements and store the measurements in computer memory, each room measurement defining the boundaries of a room within a structure, the structure having a plurality of adjoining rooms, at least a plurality of the adjoining rooms having shared openings;
a modelling module that is configured to:
receive a plurality of images for rooms in the structure and construct panoramic images of the rooms from the received images, the received images and the received room measurements being encoded with orientation information,
generate composite room models from the received room measurements and the panoramic images, and
automatically identify openings in the rooms based on the plurality of room measurements and to assign, after the plurality of measurements have been received, a unique identifier, defined by a user, to openings that are shared by adjoining rooms; and
a layout module that arranges the individual composite room models in a structure model, the layout module using the unique identifiers assigned to each shared opening to determine the layout of rooms within the structure model.

5. The modelling tool of claim 4 wherein the measurement interface comprises a user interface that enables a user to enter room measurements.

6. The modelling tool of claim 4 wherein the measurement interface comprises a interfacing module that interfaces with a measurement device to retrieve room measurements.

7. The modelling tool of claim 4, comprising an image interface that receives the plurality of images for a measured room and stores the images in computer memory.

8. The modelling tool of claim 4 wherein the modelling module uses the room image to construct the composite room models.

9. The modelling tool of claim 4 wherein the modelling module comprises a user interface that displays the composite room model to a user and prompts the user to identify shared openings.

10. The modelling tool of claim 9 wherein the modelling module prompts the user to assign the unique identifiers to each shared opening.

11. The modelling tool of claim 4, comprising an exterior modelling module that generates a computer representation of a structure's exterior façade, the hardware processor assigning a unique identifier to exterior openings in a structure's peripheral rooms that links the peripheral rooms to the exterior façade.

12. The modelling tool of claim 4 wherein the measurement interface is arranged to receive exterior structure measurements and store the received exterior structure measurements in computer memory, the exterior modelling module being arranged to generate the exterior façade representations from received exterior structure measurements.

13. A structure modelling method comprising:
storing a plurality of room measurements that define the boundaries of corresponding rooms within a structure in computer memory;
receiving a plurality of images for the rooms and constructing panoramic images for the rooms from the received images, the room measurements and the images being encoded with orientation information,
generating composite room models for the rooms;
automatically identifying openings in the rooms based on the plurality of room measurements;
identifying, after storing the plurality of room measurements, common openings shared by adjoining rooms within the structure and assigning each shared opening a unique identifier that is defined by a user and is linked to the stored room measurements; and
generating a structure model from the composite room models, using the unique identifiers assigned to each shared opening to determine the layout of rooms within the structure model.

14. The method of claim 13 comprising identifying the common openings in the individual composite room models.

15. The method of claim 14 comprising constructing the structure model from the individual composite room models by matching the shared openings of adjoining rooms.

16. The method of claim 13 comprising measuring spatial dimensions for a plurality of rooms within a structure space.

17. The method of claim 13 comprising assigning each room dimension measurement an orientation stamp that represents the orientation of the measurement with respect to an absolute reference.

* * * * *